(12) United States Patent
Shin

(10) Patent No.: US 9,455,244 B2
(45) Date of Patent: Sep. 27, 2016

(54) SEMICONDUCTOR PACKAGE

(71) Applicant: SAMSUNG ELECTRONICS CO., LTD., Suwon-si, Gyeonggi-do (KR)

(72) Inventor: MuSeob Shin, Chungcheongnam-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 258 days.

(21) Appl. No.: 14/104,459

(22) Filed: Dec. 12, 2013

(65) Prior Publication Data

US 2014/0306354 A1  Oct. 16, 2014

(30) Foreign Application Priority Data

Apr. 10, 2013 (KR) .......... 10-2013-0039363

(51) Int. Cl.
*H01L 21/00* (2006.01)
*H01L 25/18* (2006.01)
(Continued)

(52) U.S. Cl.
CPC ............ *H01L 25/18* (2013.01); *H01L 23/315* (2013.01); *H01L 23/3128* (2013.01); *H01L 23/49827* (2013.01); *H01L 24/94* (2013.01); *H01L 25/0652* (2013.01); *H01L 25/0655* (2013.01); *H01L 25/105* (2013.01); *H01L 23/522* (2013.01); *H01L 23/5389* (2013.01); *H01L 24/16* (2013.01); *H01L 24/29* (2013.01); *H01L 24/32* (2013.01); *H01L 24/48* (2013.01); *H01L 24/49* (2013.01); *H01L 24/73* (2013.01); *H01L 2224/02375* (2013.01); *H01L 2224/0401* (2013.01); *H01L 2224/04042* (2013.01); *H01L 2224/0557* (2013.01); *H01L 2224/05567* (2013.01); *H01L 2224/05569* (2013.01); *H01L 2224/06135* (2013.01); *H01L 2224/06145* (2013.01); *H01L 2224/06181* (2013.01); *H01L 2224/16225* (2013.01); *H01L 2224/2919* (2013.01); *H01L 2224/32145* (2013.01); *H01L 2224/32225* (2013.01); *H01L 2224/48145* (2013.01); *H01L 2224/48227* (2013.01); *H01L 2224/49109* (2013.01);
(Continued)

(58) Field of Classification Search
CPC ............... H01L 23/5389; H01L 2924/181; H01L 2924/12042
See application file for complete search history.

(56) References Cited

U.S. PATENT DOCUMENTS 6,091,156 A   7/2000  Kinoshita
6,943,430 B2  9/2005  Kwon
(Continued)

FOREIGN PATENT DOCUMENTS

JP   2003273313    9/2003
KR   1020040004798 1/2004
(Continued)

*Primary Examiner* — Laura Menz
(74) *Attorney, Agent, or Firm* — F. Chau & Associates, LLC

(57) ABSTRACT

A semiconductor package includes a package substrate. A first semiconductor chip is mounted on the package substrate. The first semiconductor chip includes a first chip region and first chip pads formed on a top surface of the first chip region. A second semiconductor chip is mounted on the package substrate. The second semiconductor chip includes a second chip region and second chip pads formed on a top surface of the second chip region. A boundary region having a groove divides the first chip region and the second chip region. The first chip region, the second chip region and the boundary region share a semiconductor substrate of a one-body type.

7 Claims, 40 Drawing Sheets

(51) Int. Cl.
  *H01L 25/065* (2006.01)
  *H01L 25/10* (2006.01)
  *H01L 23/31* (2006.01)
  *H01L 23/498* (2006.01)
  *H01L 23/00* (2006.01)
  *H01L 23/522* (2006.01)
  *H01L 23/538* (2006.01)

(52) U.S. Cl.
  CPC .............. *H01L 2224/49175* (2013.01); *H01L 2224/73204* (2013.01); *H01L 2224/73265* (2013.01); *H01L 2224/92247* (2013.01); *H01L 2224/94* (2013.01); *H01L 2225/0651* (2013.01); *H01L 2225/06506* (2013.01); *H01L 2225/06513* (2013.01); *H01L 2225/06517* (2013.01); *H01L 2225/06541* (2013.01); *H01L 2225/06562* (2013.01); *H01L 2225/1023* (2013.01); *H01L 2225/1041* (2013.01); *H01L 2225/1058* (2013.01); *H01L 2924/10253* (2013.01); *H01L 2924/10271* (2013.01); *H01L 2924/12042* (2013.01); *H01L 2924/1431* (2013.01); *H01L 2924/1432* (2013.01); *H01L 2924/1433* (2013.01); *H01L 2924/1436* (2013.01); *H01L 2924/1437* (2013.01); *H01L 2924/1438* (2013.01); *H01L 2924/1441* (2013.01); *H01L 2924/14335* (2013.01); *H01L 2924/15311* (2013.01); *H01L 2924/181* (2013.01); *H01L 2924/3511* (2013.01); *H01L 2924/37001* (2013.01)

(56) References Cited

U.S. PATENT DOCUMENTS

| | | | |
|---|---|---|---|
| 7,215,018 | B2 | 5/2007 | Vindasius et al. |
| 7,592,237 | B2 | 9/2009 | Sakamoto et al. |
| 7,795,073 | B2 | 9/2010 | Han et al. |
| 8,110,922 | B2 | 2/2012 | Chung et al. |
| 8,198,176 | B2 | 6/2012 | Hatakeyama et al. |
| 2007/0246826 | A1 | 10/2007 | Chung et al. |
| 2009/0117710 | A1 | 5/2009 | Kim et al. |
| 2013/0154074 | A1* | 6/2013 | Oh .................. H01L 21/561 257/676 |
| 2014/0054783 | A1* | 2/2014 | Gong ................ H01L 24/19 257/773 |
| 2014/0054796 | A1* | 2/2014 | Gong ................ H01L 25/0657 257/777 |
| 2014/0306354 | A1* | 10/2014 | Shin ............. H01L 23/49827 257/777 |
| 2015/0311188 | A1* | 10/2015 | Mao ................ H01L 25/50 438/15 |

FOREIGN PATENT DOCUMENTS

| | | |
|---|---|---|
| KR | 1020050004636 | 1/2005 |
| KR | 1020050059791 | 6/2005 |
| KR | 1020050063052 | 6/2005 |
| KR | 100594316 | 6/2006 |
| KR | 1020060075073 | 7/2006 |
| KR | 100703816 | 3/2007 |
| KR | 1020080076090 | 8/2008 |
| KR | 1020090046174 | 5/2009 |
| KR | 1020110083278 | 7/2011 |
| KR | 1020110107989 | 10/2011 |

* cited by examiner

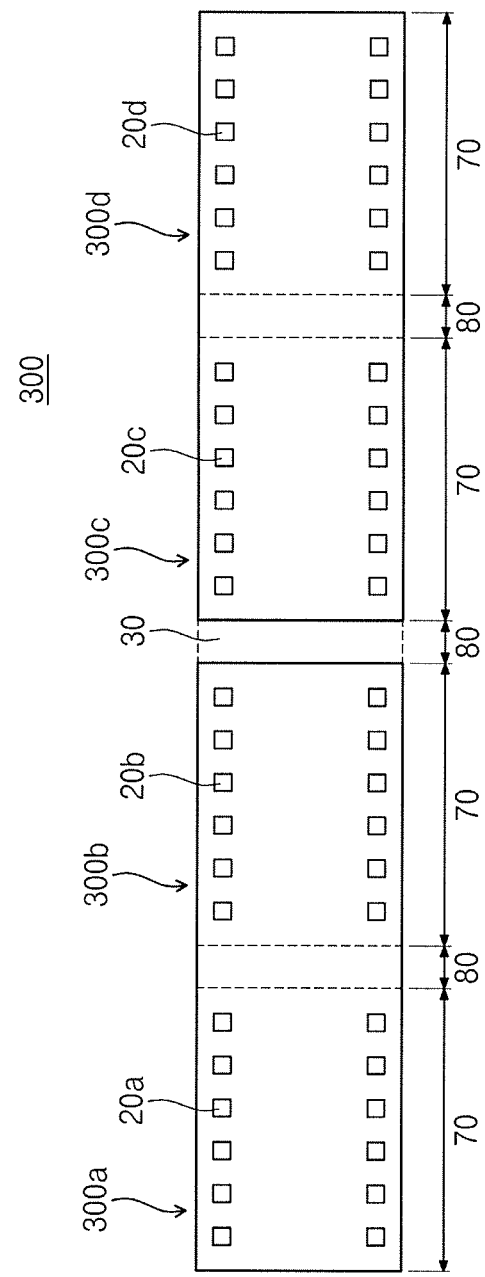

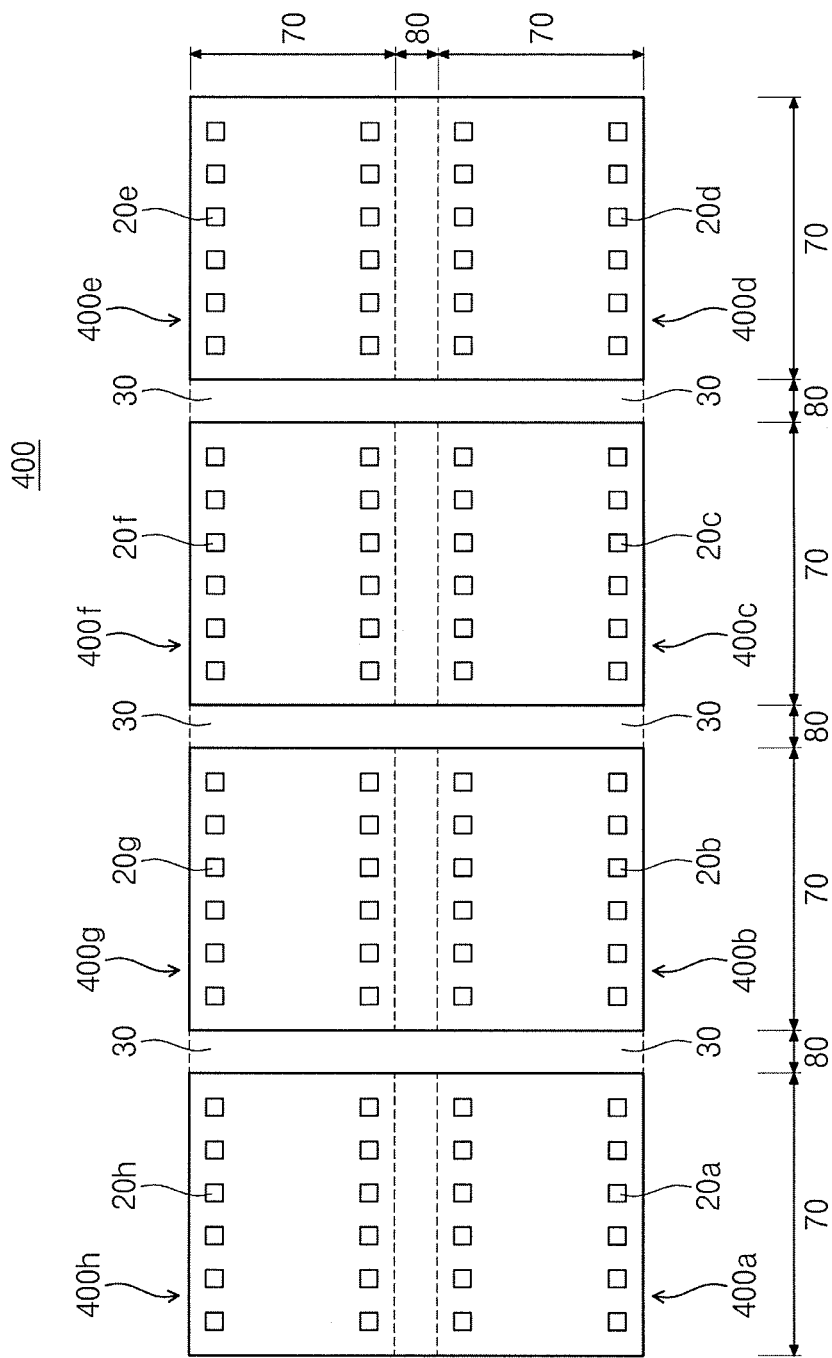

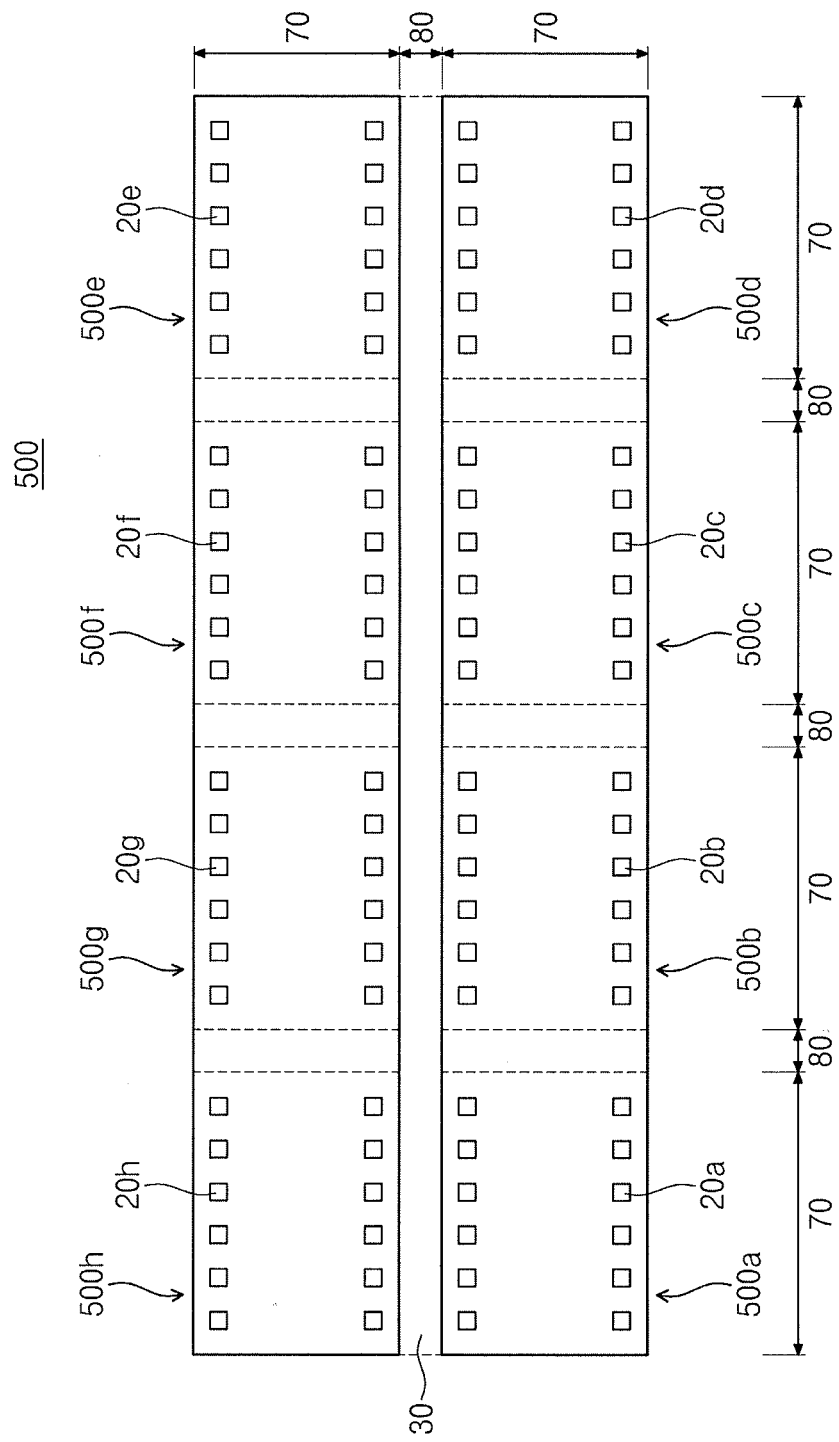

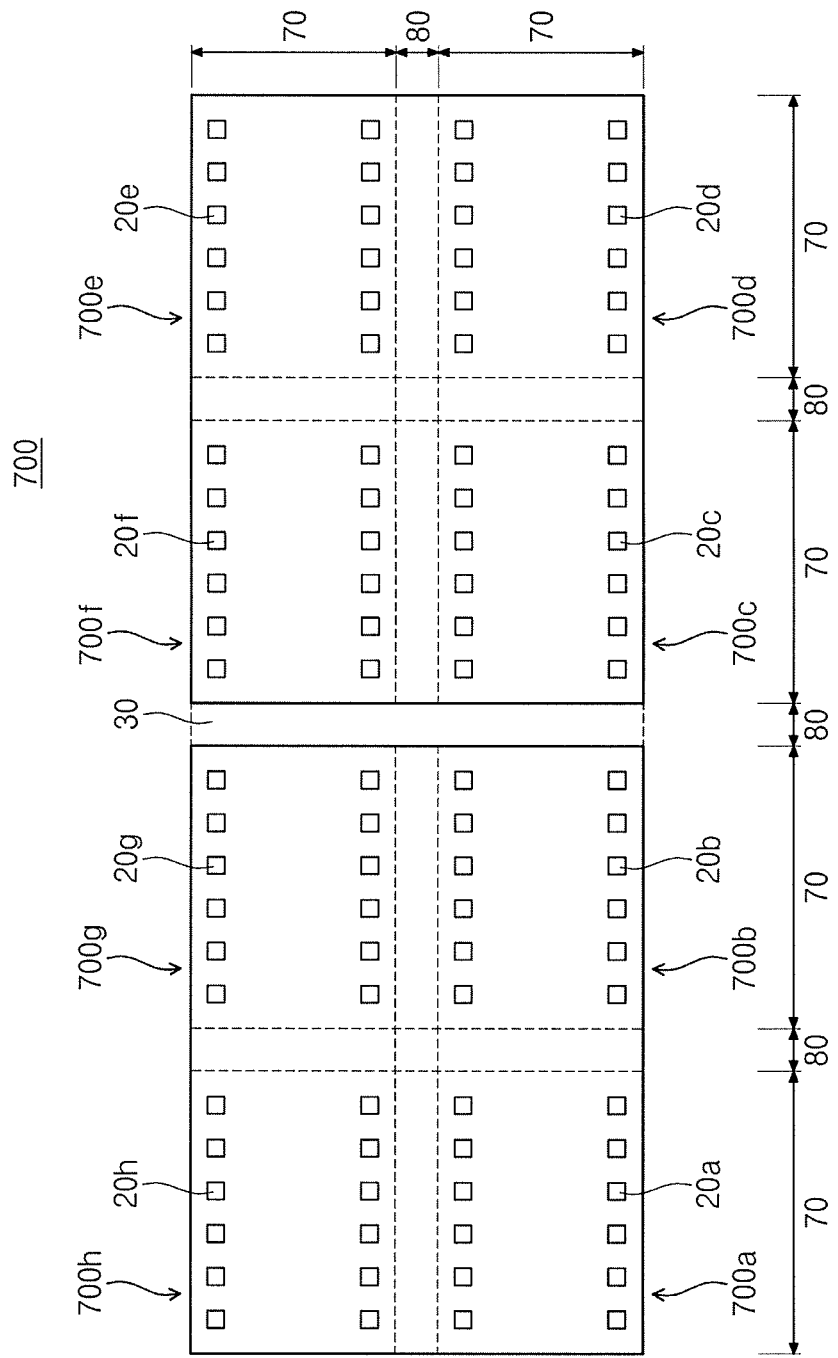

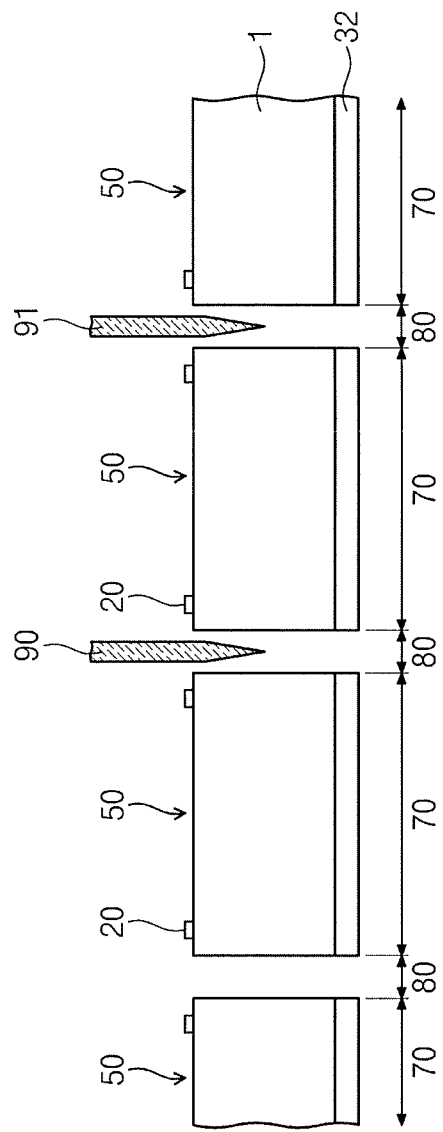

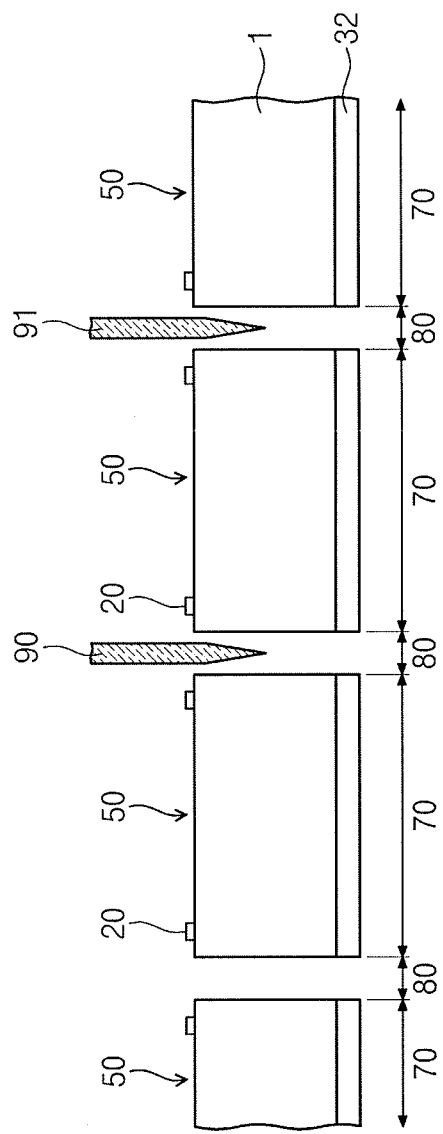

SEMICONDUCTOR PACKAGE

CROSS-REFERENCE TO RELATED APPLICATION

This U.S. non-provisional patent application claims priority under 35 U.S.C. §119 to Korean Patent Application No. 10-2013-0039363, filed on Apr. 10, 2013, in the Korean Intellectual Property Office, the disclosure of which is incorporated by reference herein in its entirety.

BACKGROUND

The present inventive concept relates to a semiconductor package, and more particularly, to a semiconductor package in which semiconductor chips are disposed in parallel.

Horizontal and vertical arrangements techniques of semiconductor chips for lighter, thinner, shorter and smaller semiconductor packages have been developed to reduce mounting areas of parts in electronic devices as sizes of the electronic devices have been reduced.

SUMMARY

Exemplary embodiments of the present inventive concept may provide a semiconductor package having a semiconductor chip, which is capable of increasing a mounting density of a substrate and ensuring reliability in a packaging process.

Exemplary embodiments of the present inventive concept may also provide a semiconductor package including a plurality of horizontally arranged unit semiconductor chips.

According to an exemplary embodiment of the present inventive concept, a semiconductor package includes a package substrate. A first semiconductor chip is mounted on the package substrate. The first semiconductor chip includes a first chip region and first chip pads formed on a top surface of the first chip region. A second semiconductor chip is mounted on the package substrate. The second semiconductor chip includes a second chip region and second chip pads formed on a top surface of the second chip region. The first chip region and the second chip region may be divided from each other by a boundary region having a groove. The first chip region, the second chip region and the boundary region may share a semiconductor substrate of a one-body type.

According to an exemplary embodiment of the present inventive concept, each of the first and second chip regions may include a well region.

According to an exemplary embodiment of the present inventive concept, a bottom surface of the groove may be lower than a bottom of the well region.

According to an exemplary embodiment of the present inventive concept, the semiconductor package may include a molding member formed on the package substrate.

According to an exemplary embodiment of the present inventive concept, at least a portion of the groove may be filled with the molding member.

According to an exemplary embodiment of the present inventive concept, each of the first and second semiconductor chips may include four sides. The first chip pads of the first semiconductor chip may be disposed adjacent to at least one of the four sides of the first semiconductor chip crossing an extending direction of the groove. The second chip pads of the second semiconductor chip may be disposed adjacent to at least one of the four sides of the second semiconductor chip crossing the extending direction of the groove.

According to an exemplary embodiment of the present inventive concept, each of the first and second semiconductor chips may include four sides. The first chip pads of the first semiconductor chip may be disposed adjacent to at least one of the four sides of the first semiconductor chip parallel to an extending direction of the groove. The second chip pads of the second semiconductor chip may be disposed adjacent to at least one of the four sides of the second semiconductor chip parallel to the extending direction of the groove.

According to an exemplary embodiment of the present inventive concept, a semiconductor package includes a package substrate. At least two semiconductor chips are disposed on the package substrate. The semiconductor chip is disposed in parallel on the package substrate. The semiconductor chips are divided from each other by a boundary region. The at least two semiconductor chips and the boundary region share a semiconductor substrate of a one-body type. The boundary region includes at least one groove.

According to an exemplary embodiment of the present inventive concept, a molding member may be formed on the package substrate.

According to an exemplary embodiment of the present inventive concept, at least a portion of the groove may be filled with the molding member.

According to an exemplary embodiment of the present inventive concept, an air gap may be included in the groove.

According to an exemplary embodiment of the present inventive concept, each of the semiconductor chips may include a chip region in which a well region is formed. A bottom surface of the groove formed in the boundary region may be lower than a bottom of the well region.

According to an exemplary embodiment of the present inventive concept, a semiconductor package includes first and second semiconductor chips sequentially stacked on a package substrate. An adhesive member is formed between the first and second semiconductor chips. A molding member is formed on the package substrate. Each of the first and second semiconductor chips include at least two unit semiconductor chips and a boundary region having at least one groove between the semiconductor chips. The unit semiconductor chips and the boundary region share a semiconductor substrate of a one-body type.

According to an exemplary embodiment of the present inventive concept, at least a portion of the at least one groove of the stacked first and second semiconductor chips may be filled with the adhesive member.

According to an exemplary embodiment of the present inventive concept, at least a portion of the groove of an uppermost semiconductor chip of the stacked first and second semiconductor chips may be filled with the molding member.

According to an exemplary embodiment of the present inventive concept, an air gap may be provided in the at least one groove.

According to an exemplary embodiment of the present inventive concept, the stacked first and second semiconductor chips may have an overlapping region and a non-overlapping region.

According to an exemplary embodiment of the present inventive concept, at least a portion of the at least one groove of the stacked first and second semiconductor chips may be filled with the adhesive member and the molding member.

According to an exemplary embodiment of the present inventive concept, each of the unit semiconductor chips may include a chip region in which a well region is formed. A bottom surface of the at least one groove of the boundary region may be lower than a bottom of the well region of the chip region.

According to an exemplary embodiment of the present inventive concept, each of the unit semiconductor chips may include four sides. Each of the unit semiconductor chips may include chip pads disposed adjacent to at least one of the sides crossing or parallel to an extending direction of the at least one groove.

BRIEF DESCRIPTION OF THE DRAWINGS

The above and other features of the inventive concept will become more apparent by describing in detail exemplary embodiments thereof, with reference to the accompanying drawings in which:

FIGS. 3A to 8A are plan views illustrating semiconductor chips according to exemplary embodiments of the present inventive concept;

FIGS. 3B to 8B are perspective views illustrating semiconductor chips according to exemplary embodiments of the present inventive concept;

FIGS. 17A and 17B are cross-sectional views of FIG. 16;

FIGS. 18A to 18C are cross-sectional views a process of forming semiconductor chips according to exemplary embodiments of the present inventive concept;

DETAILED DESCRIPTION OF THE EMBODIMENTS

Figure 1A:
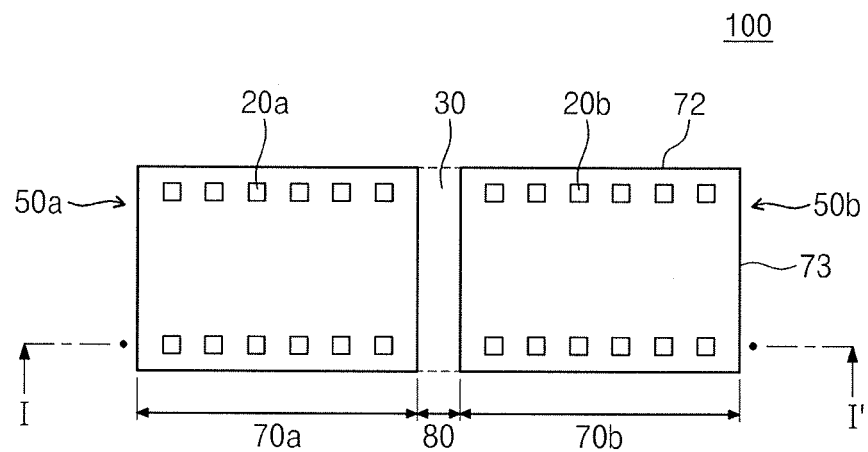
FIGS. 1A to 1C are a plan view, a perspective view, and a cross-sectional view illustrating a semiconductor chip according to exemplary embodiments of the present inventive concept, respectively.

The present inventive concept will now be described more fully hereinafter with reference to the accompanying drawings, in which exemplary embodiments of the present inventive concept are shown. It should be noted, however, that the inventive concept is not limited to the following exemplary embodiments, and may be implemented in various forms. In the drawings, the thickness of layers and regions may be exaggerated for clarity.

As used herein, the singular terms "a," "an" and "the" are intended to include the plural forms as well, unless the context clearly indicates otherwise. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present.

The same reference numerals or the same reference designators may denote the same elements throughout the specification.

Figure 1B:
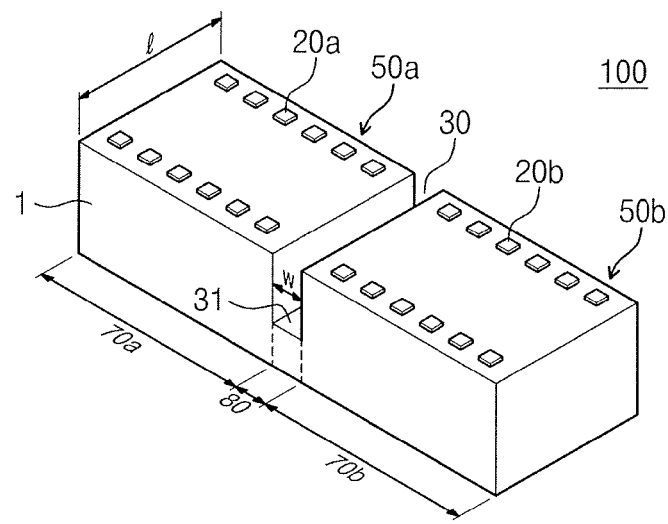
Figure 1C:
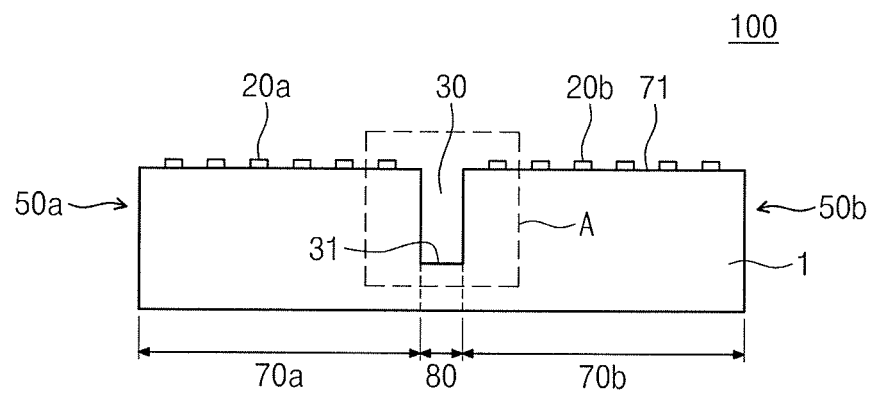
Figure 1D:
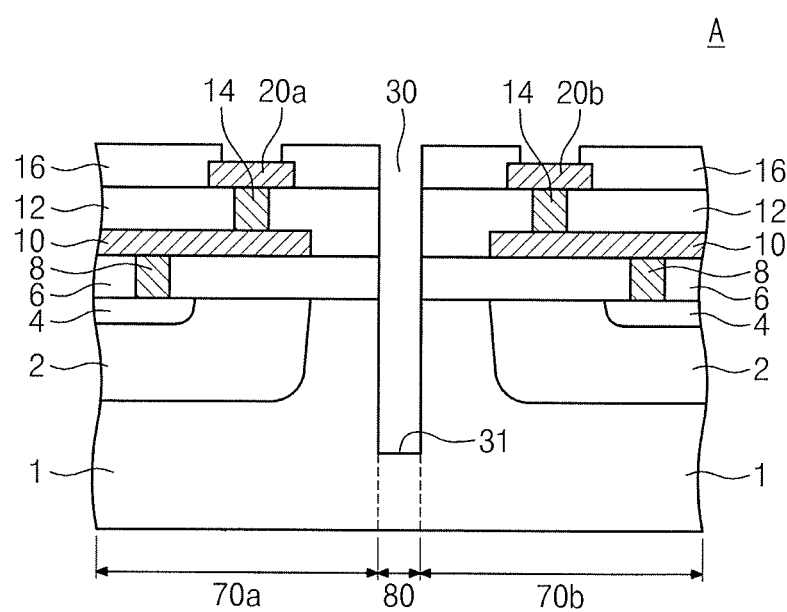
FIG. 1D is an enlarged view of a portion 'A' of FIG. 1C.

FIGS. 1A and 1B are a plan view and a perspective view illustrating a semiconductor chip 100 according to an exemplary embodiment of the present inventive concept, respectively. FIG. 1C is a cross-sectional view taken along a line I-I' of FIG. 1A, and FIG. 1D is an enlarged view of a portion 'A' of FIG. 1C.

Referring to FIGS. 1A to 1D, the semiconductor chip 100 according to exemplary embodiments of the present inventive concept may include a first unit semiconductor chip 50a and a second unit semiconductor chip 50b which may be divided by a boundary region 80 and may be disposed in parallel. The first unit semiconductor chip 50a may include a first chip region 70a, and the second unit semiconductor chip 50b may include a second chip region 70b. The first chip region 70a and the second chip region 70b may be divided by the boundary region 80. The boundary region 80 may be a scribe lane. The first and second chip regions 70a and 70b may include semiconductor integrated circuits. The semiconductor integrated circuits may include a semiconductor memory device (e.g., a dynamic random access memory (DRAM) device, a flash memory device, magnetic random access memory (MRAM) device, a phase change random access memory (PRAM) device, a resistive random access memory (ReRAM) device, and/or a static random access memory (SRAM) device), a semiconductor logic device (e.g., a central process unit (CPU), a digital signal processor (DSP), and/or a controller), and/or an optoelectronic device.

The first unit semiconductor chip 50a and the second unit semiconductor chip 50b may be semiconductor chips having the same function. For example, the first and second unit semiconductor chips 50a and 50b may be DRAM devices. The first unit semiconductor chip 50a and the second unit semiconductor chip 50b may be different kinds of chips having different functions. For example, the first unit semiconductor chip 50a may be a flash memory device, and the second unit semiconductor chip 50b may be a logic device.

A groove 30 may be provided in the boundary region 80 between the first unit semiconductor chip 50a and the second unit semiconductor chip 50b. The groove 30 may have a predetermined depth. A width W of the groove 30 may be equal to or less than a width of the boundary region 80. The boundary region 80 having the groove 30, the first chip region 70a of the first unit semiconductor chip 50a, and the second chip region 70b of the second unit semiconductor chip 50b may share a semiconductor substrate 1. The semiconductor substrate 1 may be a one-body type. For example, the first unit semiconductor chip 50a, the second unit semiconductor chip 50b, and the boundary region 80 may share the semiconductor substrate 1 of the one-body type. The semiconductor substrate 1 may include, for example, a silicon substrate, a silicon containing substrate, a germanium substrate, a silicon-on-insulator (SOI) substrate, or a compound semiconductor substrate.

Each of the first and second unit semiconductor chips 50a and 50b may have a pair of first sides 72 parallel to each other and a pair of second sides 73 perpendicular to the first sides 72. The second sides 73 may be parallel to the groove 30. The first sides 72 may be long sides and the second sides 73 may be short sides. First chip pads 20a and second chip pads 20b may be disposed on top surfaces 71 of the chip regions 70a and 70b of the first and second unit semiconductor chips 50a and 50b, respectively. The first chip pads 20a of the first unit semiconductor chip 50a and the second chip pads 20b of the second unit semiconductor chip 50b may be arranged to be adjacent and parallel to the first sides 72 and may cross an extending direction of the groove 30 (e.g., a longitudinal direction of the groove 30).

FIG. 1D is an enlarged view of a region 'A' illustrated in FIG. 1C. FIG. 1D illustrates structures of the integrated circuits including the first and second chip pads 20a and 20b. Well regions 2 and dopant doped regions 4 constituting semiconductor transistors may be formed in the semiconductor substrate 1 of the chip regions 70a and 70b of the first and second unit semiconductor chips 50a and 50b. First conductive plugs 8 connected to the dopant doped regions 4 may be formed in a first insulating layer 6. The first conductive plugs 8 may be connected to metal interconnections 10. Second conductive plugs 14 formed in a second insulating layer 12 may electrically connect the metal interconnections 10 to the first and second chip pads 20a and 20b formed thereon. A passivation layer 16 may be provided to partially expose the first and second pads 20a and 20b. The groove 30 of the boundary region 80 may be formed to be deeper than the well region 2 such that a bottom surface 31 of the groove 30 may be lower than a bottom surface of the well region 2. The groove 30 is formed to be deeper than the well region 2, and a conductive connection between the first and second unit semiconductor chips 50a and 50b may be prevented. Generally, as a semiconductor chip becomes thinner, a warpage degree of the semiconductor chip may be increased. However, a warpage stress of the semiconductor chip 100 may be relaxed by the groove 30 provided, for example, in the boundary region 80 of the unit semiconductor chips 50a and 50b, thereby inhibiting warpage of the semiconductor chip 100. If the semiconductor chip 100 that does not include the groove 30 is warped, an edge of the semiconductor chip 100 may be separated from a package substrate and may cause, for example, a contact error of a bonding wire. Thus, a yield of an assembling process of a semiconductor package and reliability of a semiconductor package may be reduced. The warpage stress of the semiconductor chip 100 according to the inventive concept may be relaxed by the groove 30 in the boundary region 80 such that the yield of the assembling process and the reliability of the semiconductor package may be increased.

FIGS. 2A to 2D are plan views illustrating pad arrangements of semiconductor chips according to exemplary embodiments of the present inventive concept.

Figure 2A:
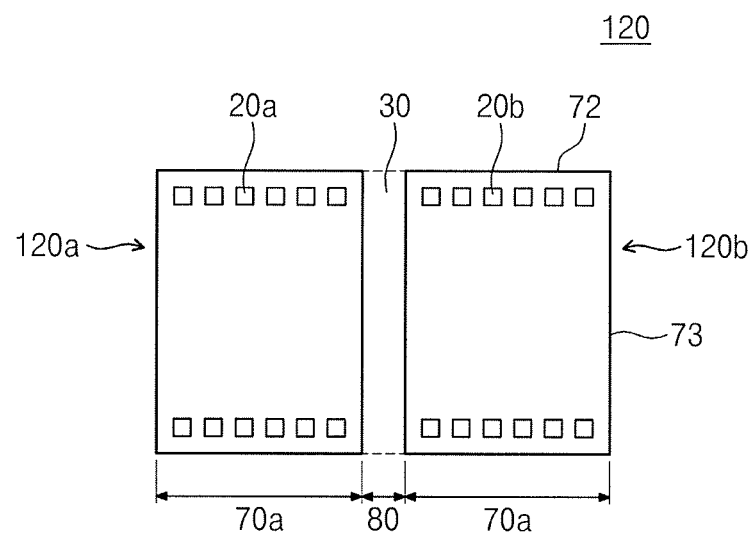
FIGS. 2A to 2D are plan views illustrating pad arrangements of semiconductor chips according to exemplary embodiments of the present inventive concept.

Referring to FIG. 2A, a semiconductor chip 120 according to exemplary embodiments of the inventive concept may include first and second unit semiconductor chips 120a and 120b. The first unit semiconductor chip 120a and the second unit semiconductor chip 120b may be divided by a boundary region 80. Each of the first and second unit semiconductor chips 120a and 120b may have a pair of first sides 72 parallel to each other and a pair of second sides 73 perpendicular to the first sides 72. The first sides 72 may be short sides and the second sides 73 may be long sides. First and second chip pads 20a and 20b may be disposed to be adjacent to the first sides 72, and may cross an extending direction of the groove 30 in the boundary region 80. Except for the shapes of the sides, the rest of the elements of the semiconductor chip 120 may be the same as corresponding elements of the semiconductor chip 100 described with reference to FIGS. 1A to 1D.

Figure 2B:
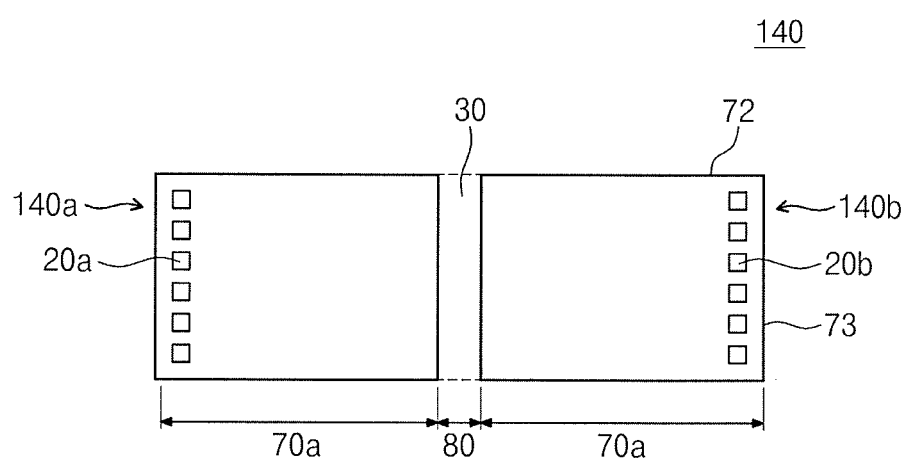

Referring to FIG. 2B, a semiconductor chip 140 according to exemplary embodiments of the present inventive concept may include first and second unit semiconductor chips 140a and 140b. The first unit semiconductor chip 140a and the second unit semiconductor chip 140b may be divided by a boundary region 80. Each of the first and second unit semiconductor chips 140a and 140b may have a pair of first sides 72 parallel to each other and a pair of second sides 73 perpendicular to the first sides 72. Each of the first and second sides 72 and 73 may be a short side or a long side. The first chip pads 20a may be disposed to be adjacent to one of the second sides 73 of the first unit semiconductor chip 140a and away from the boundary region 80. The second chip pads 20b may be disposed to be adjacent to one of the second sides 73 of the second unit semiconductor chip 140b and away from the boundary region 80. Except for the arrangement of the chip pads 20a and 20b, the rest of the elements of the semiconductor chip 140 may be the same as corresponding elements of the semiconductor chip 100 described with reference to FIGS. 1A to 1D.

Figure 2C:
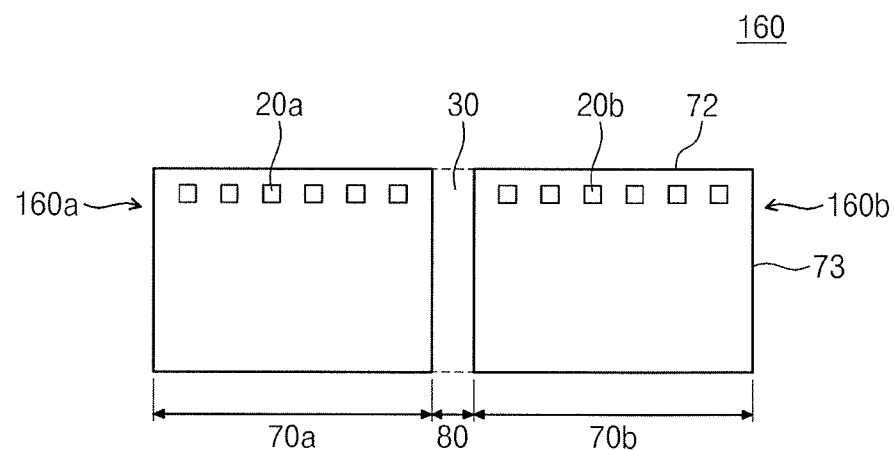

Referring to FIG. 2C, a semiconductor chip 160 according to exemplary embodiments of the present inventive concept may include first and second unit semiconductor chips 160a and 160b. The first unit semiconductor chip 160a and the second unit semiconductor chip 160b may be divided by a boundary region 80. Each of the first and second unit semiconductor chips 160a and 160b may have a pair of first sides 72 parallel to each other and a pair of second sides 73 perpendicular to the first sides 72. Each of the first and second sides 72 and 73 may be a short side or a long side. The first chip pads 20a may be disposed to be adjacent to one of the first sides 72 crossing the extending direction of the groove 30 of the first unit semiconductor chip 160a. The first chip pads 20b may be disposed to be adjacent to one of the first sides 72 crossing the extending direction of the groove 30 of the second unit semiconductor chip 160b. Except for the arrangement of the chip pads 20a and 20b, the rest of the elements of the semiconductor chip 160 may be the same as corresponding elements of the semiconductor chip 100 described with reference to FIGS. 1A to 1D.

Figure 2D:
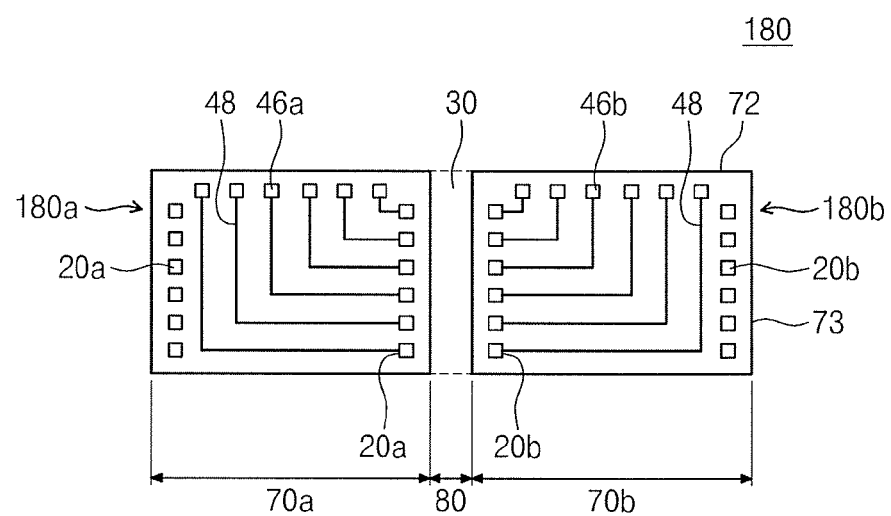

Referring to FIG. 2D, a semiconductor chip 180 according to exemplary embodiments of the present inventive concept may include first and second unit semiconductor chips 180a and 180b. The chip pads 20a and 20b may be disposed to be adjacent to the second sides 73 parallel to the extending direction of the groove 30. The chip pads 20*a* and 20*b* may be connected to redistribution chip pads 46*a* and 46*b* disposed to be adjacent to the first sides 72 crossing the extending direction of the groove 30 through redistribution lines 48. Each of the first and second sides 72 and 73 may be a short side or a long side. Except for the arrangement of the chip pads 20*a*, 20*b*, 46*a*, and 46*b* and the redistribution lines 48, the rest of the elements of the semiconductor chip 180 may be the same as corresponding elements of the semiconductor chip 100 described with reference to FIGS. 1A to 1D.

Figure 3A:
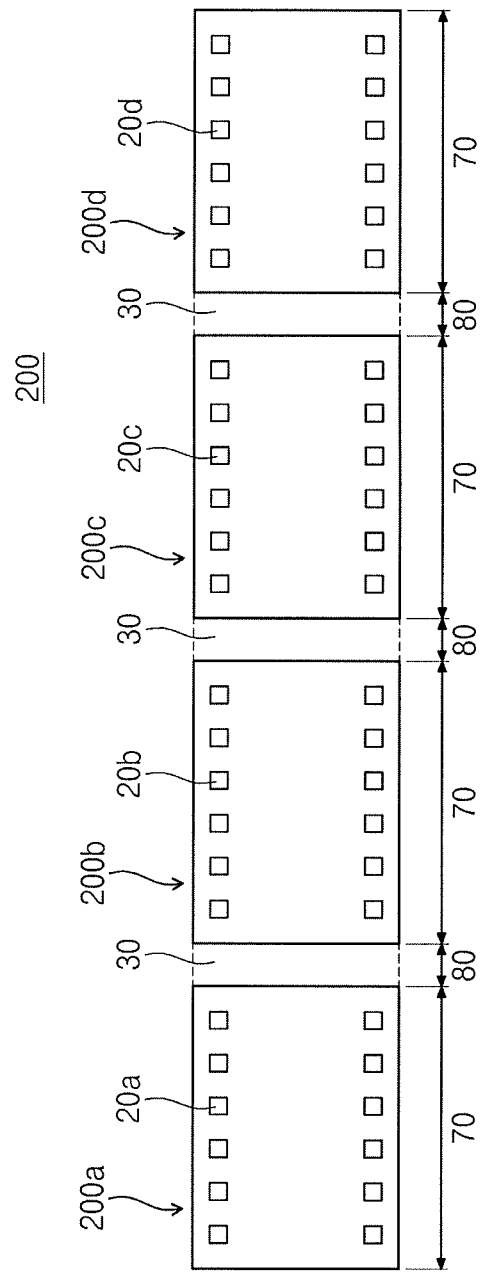
Figure 3B:
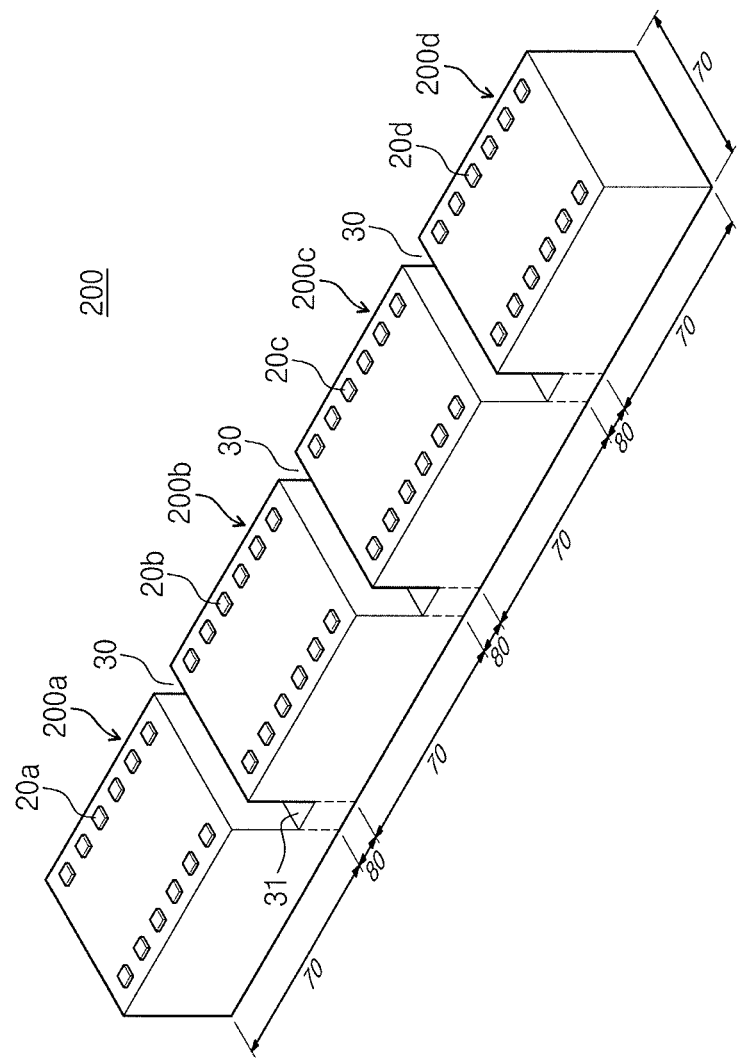

FIGS. 3A and 3B are a plan view and a perspective view of a semiconductor chip 200 according to exemplary embodiments of the present inventive concept, respectively.

Referring to FIGS. 3A and 3B, the semiconductor chip 200 according to exemplary embodiments of the present inventive concept may include three or more unit semiconductor chips disposed in parallel, for example, four unit semiconductor chips. The unit semiconductor chips 200*a*, 200*b*, 200*c*, and 200*d*, for example, may be divided by boundary regions 80, and a groove 30 may be provided in each of the boundary regions 80. The semiconductor chip 200 including the four unit semiconductor chips is illustrated as an example in FIGS. 3A and 3B. However, the semiconductor chip 200 may include three or more than four unit semiconductor chips arranged or disposed in parallel. Chip pads 20*a*, 20*b*, 20*c*, and 20*d* formed on top surfaces of the unit semiconductor chips 200*a*, 200*b*, 200*c*, and 200*d* may be disposed to be adjacent to sides crossing the extending direction of the groove 30, similarly to the pad arrangements described with reference to FIGS. 1A, 2A, and 2C. The chip pads 20*a*, 20*b*, 20*c*, and 20*d* may be disposed to be adjacent to sides parallel to the extending direction of the groove 30 and sides crossing the extending direction of the groove 30, as described with reference to FIG. 2D. The groove 30 may be formed to be deeper than the well region 2 such that a bottom surface 31 of the groove 30 may be lower than a bottom of the well region 2, as illustrated in FIG. 1D. The unit semiconductor chips 200*a*, 200*b*, 200*c*, and 200*d* and the boundary regions 80 may share a semiconductor substrate 1 of the one-body type.

Figure 4B:
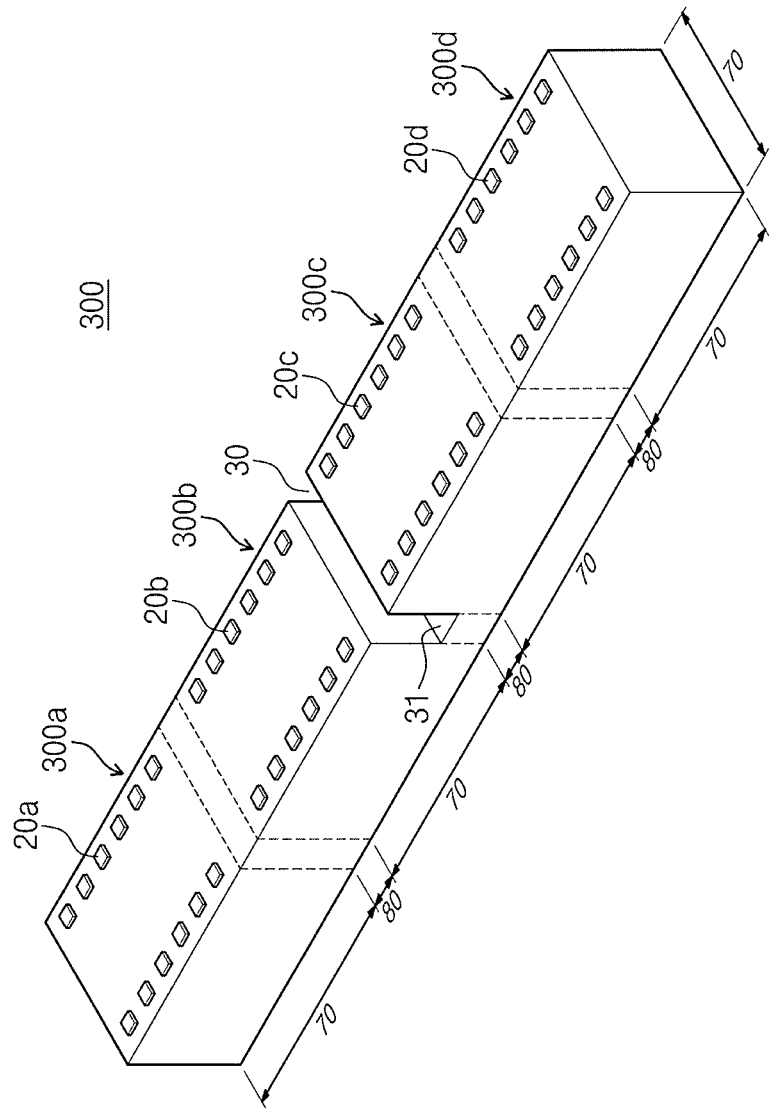

FIGS. 4A and 4B are a plan view and a perspective view of a semiconductor chip 300 according to exemplary embodiments of the present inventive concept, respectively.

Referring to FIGS. 4A and 4B, the semiconductor chip 300 according to exemplary embodiments of the present inventive concept may include four unit semiconductor chips 300*a*, 300*b*, 300*c*, and 300*d*. The groove 30 may not be formed in all boundary regions 80 between the unit semiconductor chips 300*a*, 300*b*, 300*c*, and 300*d*. The groove 30 may be formed in the boundary region 80 between two unit semiconductor chip groups, for example, a first unit semiconductor chip group (300*a* and 300*b*) and a second unit semiconductor chip group (300*c* and 300*d*). For example, at least one of the boundary regions 80 may include the groove 30 but at least another of the boundary regions 80 may not include the groove 30. The semiconductor chip 300 including the four unit semiconductor chips is illustrated as an example in FIGS. 4A and 4B. In exemplary embodiments of the present inventive concept, the semiconductor chip 300 may include five or more unit semiconductor chips. Chip pads 20*a*, 20*b*, 20*c*, and 20*d* may be disposed on top surfaces of chip regions 70 of the unit semiconductor chips 300*a*, 300*b*, 300*c*, and 300*d*. The chip pads 20*a*, 20*b*, 20*c*, and 20*d* may be disposed to be adjacent to sides crossing the extending direction of the groove 30, similarly to the pad arrangements described with reference to FIGS. 1A, 2A, and 2C. Alternatively, the chip pads 20*a*, 20*b*, 20*c*, and 20*d* may be disposed to be adjacent to sides parallel to the extending direction of the groove 30 and sides crossing the extending direction of the groove 30, as described with reference to FIG. 2D. The groove 30 may be formed to be deeper than the well region 2 such that a bottom surface 31 of the groove 30 may be lower than a bottom of the well region 2, as illustrated in FIG. 1D. The unit semiconductor chips 300*a*, 300*b*, 300*c*, and 300*d* and the boundary regions 80 may share a semiconductor substrate 1 of the one-body type.

Figure 5B:
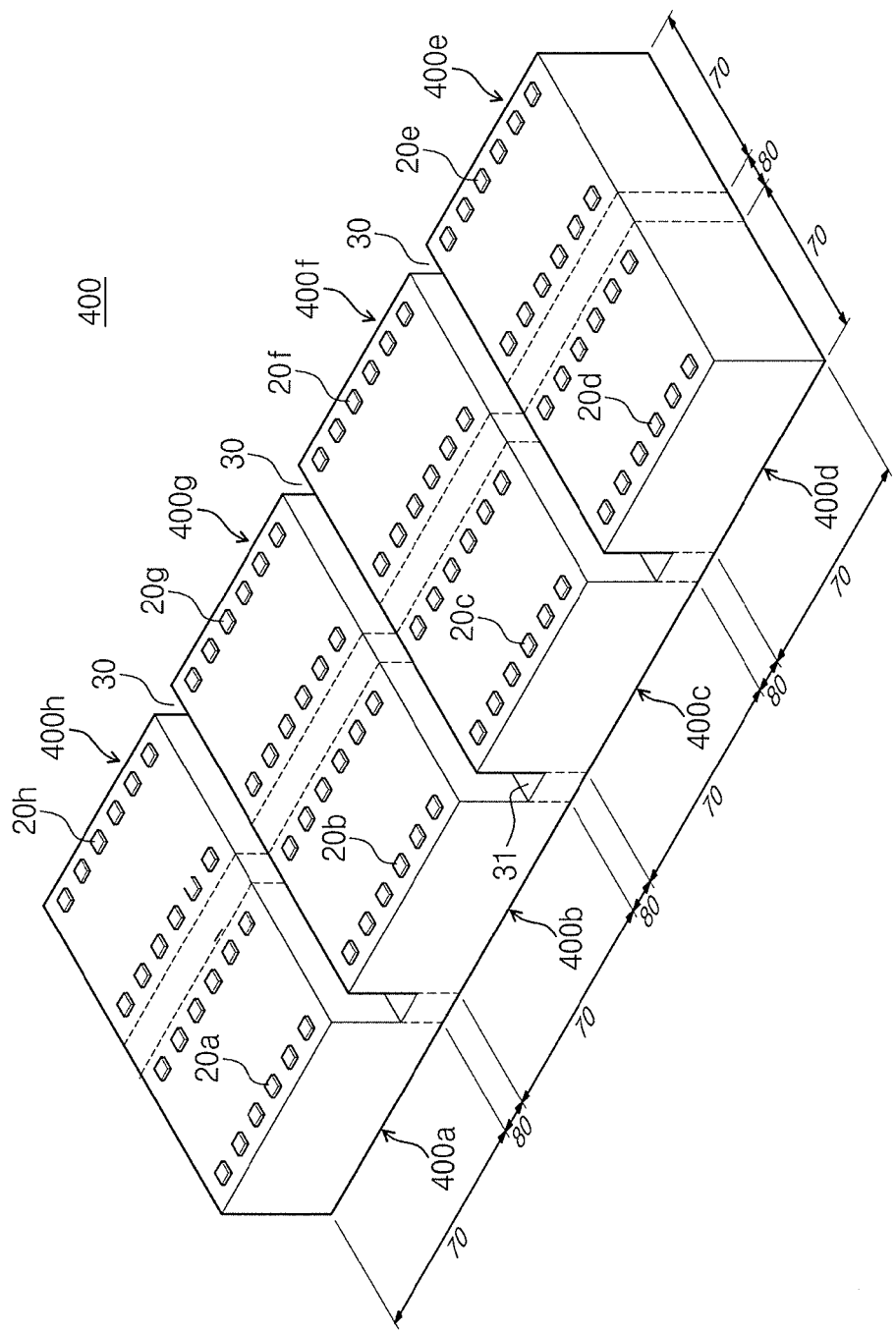

FIGS. 5A and 5B are a plan view and a perspective view of a semiconductor chip 400 according to exemplary embodiments of the inventive concept, respectively.

Referring to FIGS. 5A and 5B, the semiconductor chip 400 according to exemplary embodiments of the inventive concept may include at least four unit semiconductor chips arranged in at least two columns. For example, the semiconductor chip 400 may include eight unit semiconductor chips 400*a*, 400*b*, 400*c*, 400*d*, 400*e*, 400*f*, 400*g*, and 400*h* arranged in four columns. The semiconductor chip 400 may include four groups of which each consists of a pair of unit semiconductor chips arranged in each column. For example, the semiconductor chip 400 may include a first unit semiconductor chip group (400*a* and 400*h*), a second unit semiconductor chip group (400*b* and 400*g*), a third unit semiconductor chip group (400*c* and 400*f*), and a fourth unit semiconductor chip group (400*d* and 400*e*). A groove 30 may be formed in each boundary region 80 between the first to fourth unit semiconductor chip groups (400*a* and 400*h*, 400*b* and 400*g*, 400*c* and 400*f*, and 400*d* and 400*e*). Chip pads 20*a*, 20*b*, 20*c*, 20*d*, 20*e*, 20*f*, 20*g*, and 20*h* may be disposed on top surfaces of chip regions 70 of the first to fourth unit semiconductor chip groups (400*a* and 400*h*, 400*b* and 400*g*, 400*c* and 400*f*, and 400*d*, and 400*e*). The chip pads 20*a*, 20*b*, 20*c*, 20*d*, 20*e*, 20*f*, 20*g*, and 20*h* may be disposed to be adjacent to sides crossing the extending direction of the groove 30, similarly to the pad arrangements described with reference to FIGS. 1A, 2A, and 2C. The chip pads 20*a*, 20*b*, 20*c*, 20*d*, 20*e*, 20*f*, 20*g*, and 20*h* may be disposed to be adjacent to sides parallel to the extending direction of the groove 30 and sides crossing the extending direction of the groove 30, as described with reference to FIG. 2D. The groove 30 may be formed to be deeper than the well region 2 such that a bottom surface 31 of the groove 30 may be lower than a bottom of the well region 2, as illustrated in FIG. 1D. The unit semiconductor chips 400*a*, 400*b*, 400*c*, 400*d*, 400*e*, 400*f*, 400*g*, and 400*h* and the boundary regions 80 may share a semiconductor substrate 1 of the one-body type.

Figure 6B:
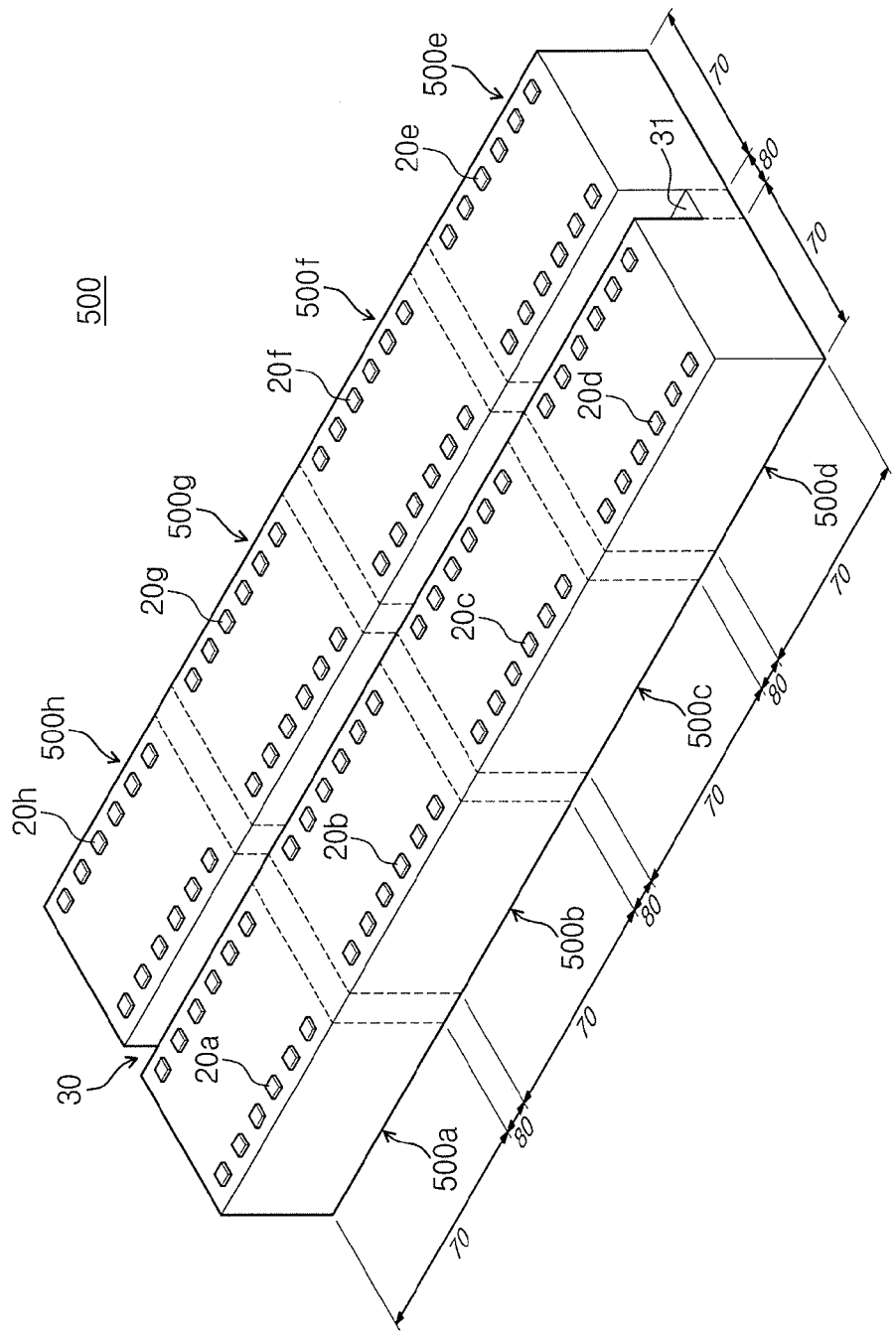

FIGS. 6A and 6B are a plan view and a perspective view of a semiconductor chip 500 according to exemplary embodiments of the inventive concept, respectively.

Referring to FIGS. 6A and 6B, the semiconductor chip 500 according to exemplary embodiments of the present inventive concept may include at least four unit semiconductor chips arranged in at least two rows. For example, the semiconductor chip 500 may include eight unit semiconductor chips 500*a*, 500*b*, 500*c*, 500*d*, 500*e*, 500*f*, 500*g*, and 500*h* arranged in two rows. The semiconductor chip 500 may include two groups of which each consists of four unit semiconductor chips arranged in each row. For example, the semiconductor chip 500 may include a first unit semiconductor chip group (500*a*, 500*b*, 500*c*, and 500*d*) and a second unit semiconductor chip group (500*e*, 500*f*, 500*g*, and 500*h*). A groove 30 may be formed in a boundary region 80 between the first unit semiconductor chip group (500*a*, 500b, 500c, and 500d) and the second unit semiconductor chip group (500e, 500f, 500g, and 500h). Chip pads 20a, 20b, 20c, 20d, 20e, 20f, 20g, and 20h may be disposed on top surfaces of chip regions 70 of the unit semiconductor chips 500a, 500b, 500c, 500d, 500e, 500f, 500g, and 500h. The chip pads 20a, 20b, 20c, 20d, 20e, 20f, 20g, and 20h may be disposed to be adjacent to sides parallel to an extending direction of the groove 30. For example, the chip pads 20a, 20b, 20c, 20d, 20e, 20f, 20g, and 20h may be disposed to be adjacent to the side away from the groove 30 and parallel to the extending direction of the groove 30, as illustrated in FIG. 2B, or the sides parallel to the extending direction of the groove 30. The second side or both the first and second sides illustrated in FIG. 2B. The chip pads 20a, 20b, 20c, 20d, 20e, 20f, 20g, and 20h may be disposed to be adjacent to sides parallel to the extending direction of the groove 30 and sides crossing the extending direction of the groove 30, as described with reference to FIG. 2D. The groove 30 may be formed to be deeper than the well region 2 such that a bottom surface 31 of the groove 30 may be lower than a bottom of the well region 2, as illustrated in FIG. 1D. The unit semiconductor chips 500a, 500b, 500c, 500d, 500e, 500f, 500g, and 500h and the boundary region 80 may share a semiconductor substrate 1 of the one-body type.

Figure 7A:
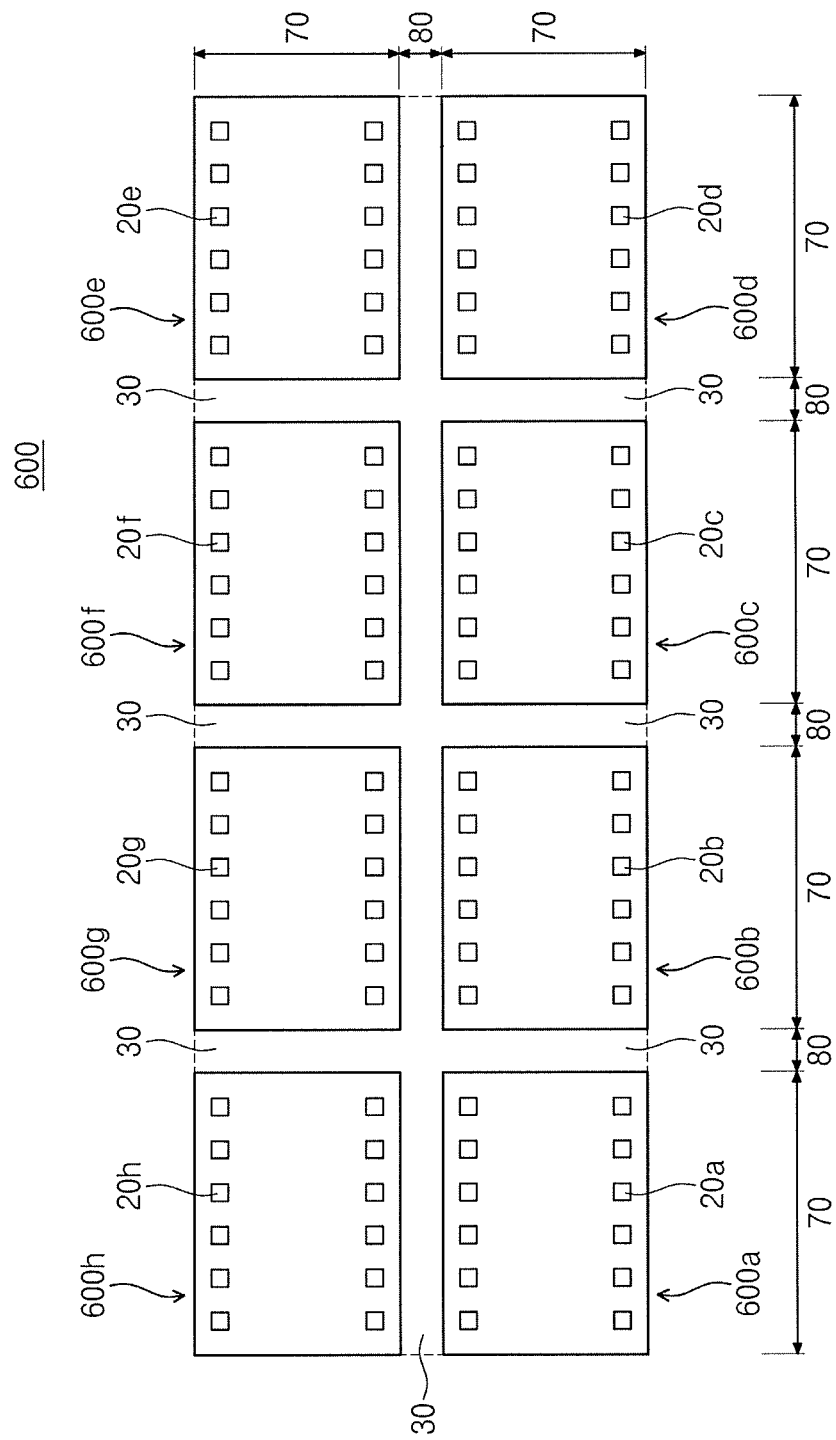
Figure 7B:
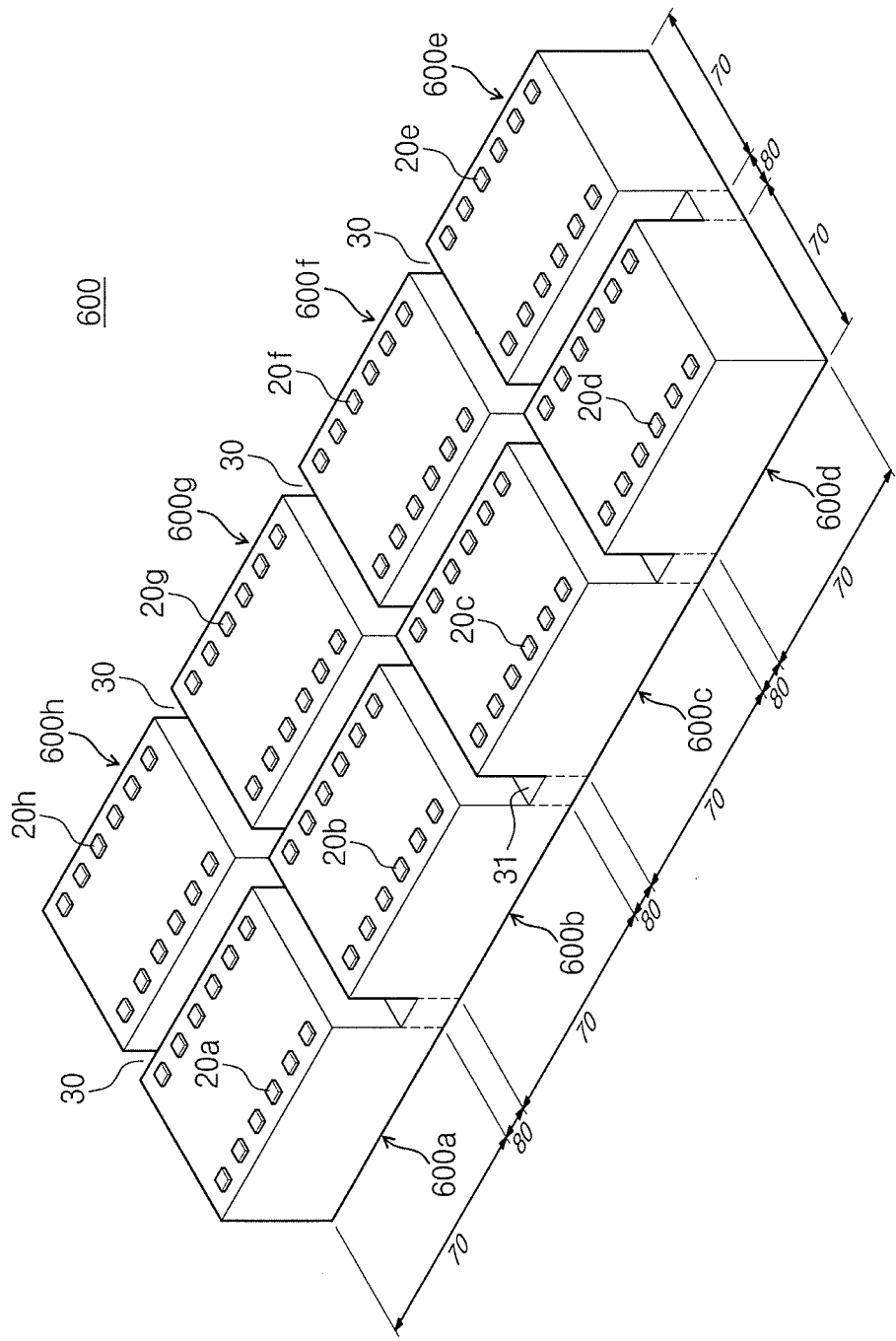

FIGS. 7A and 7B are a plan view and a perspective view of a semiconductor chip 600 according to exemplary embodiments of the present inventive concept, respectively.

Referring to FIGS. 7A and 7B, the semiconductor chip 600 according to exemplary embodiments of the present inventive concept may include at least four unit semiconductor chips arranged in at least two columns. For example, the semiconductor chip 600 may include eight unit semiconductor chips 600a, 600b, 600c, 600d, 600e, 600f, 600g, and 600h arranged in four columns. Grooves 30 may be formed in all boundary regions 80 between the unit semiconductor chips 600a, 600b, 600c, 600d, 600e, 600f, 600g, and 600h. The grooves 30 in the boundary regions 80 may be formed to be deeper than the well region 2 such that each of bottom surfaces 31 of the grooves 30 may be lower than a bottom of the well region 2, as illustrated in FIG. 1D. The unit semiconductor chips 600a, 600b, 600c, 600d, 600e, 600f, 600g, and 600h and the boundary region 80 may share a semiconductor substrate 1 of the one-body type.

Figure 8B:
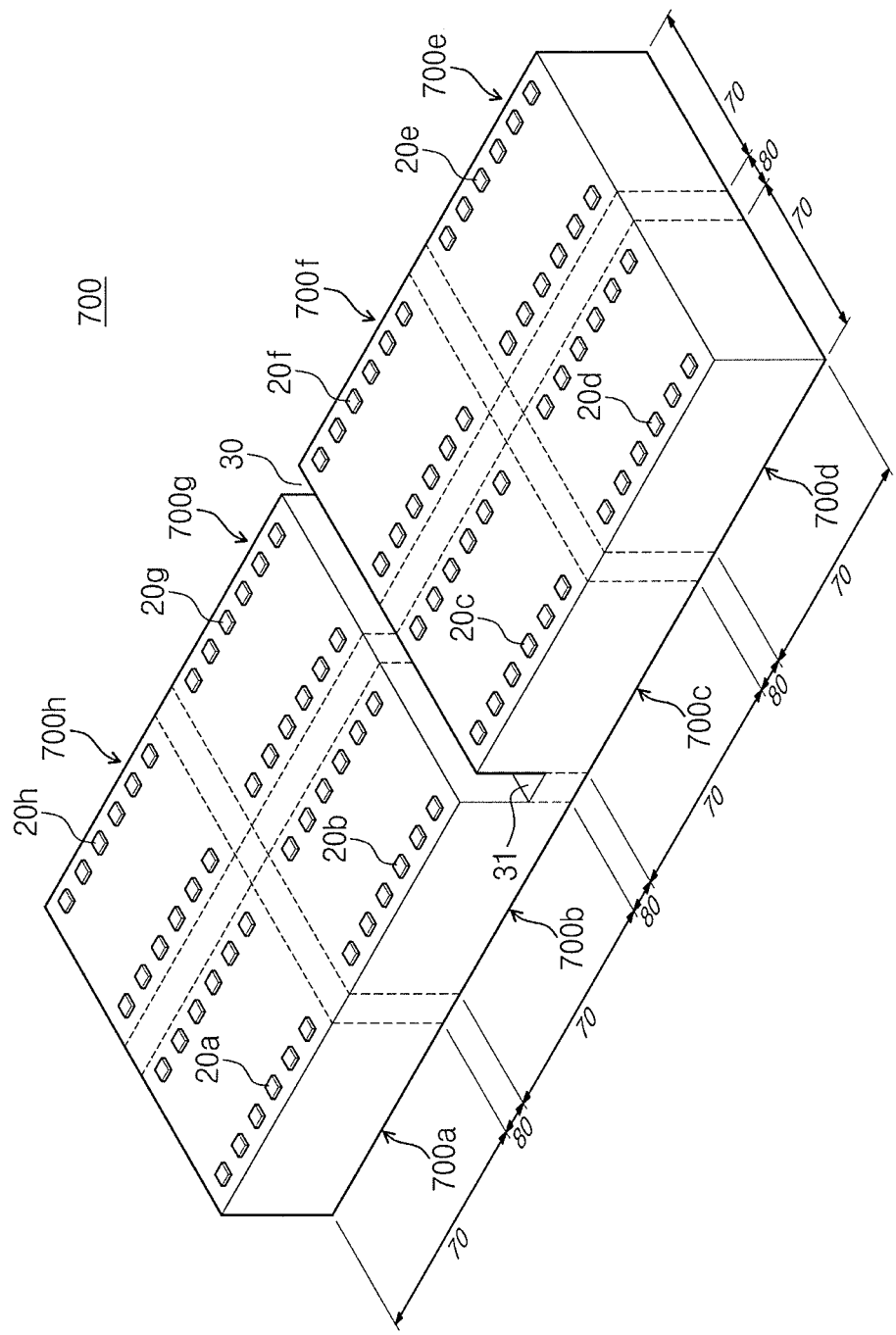

FIGS. 8A and 8B are a plan view and a perspective view of a semiconductor chip 700 according to exemplary embodiments of the present inventive concept, respectively.

Referring to FIGS. 8A and 8B, the semiconductor chip 700 according to exemplary embodiments of the present inventive concept may include unit semiconductor chip groups of which each includes four unit semiconductor chips arranged in two rows and two columns. The unit semiconductor chip groups may be disposed in parallel. For example, the semiconductor chip 700 may include a first unit semiconductor chip group including four unit semiconductor chips 700a, 700h, 700b, and 700g divided by a boundary region 80 and a second unit semiconductor chip group including four unit semiconductor chips 700c, 700f, 700d, and 700e divided by a boundary region 80. A groove 30 may be formed in a boundary region 80 between the first unit semiconductor chip group (700a, 700h, 700b, and 700g) and the second unit semiconductor chip group (700c, 700f, 700d, and 700e). The groove 30 may be formed to be deeper than the well region 2 such that a bottom surface 31 of the groove 30 may be lower than a bottom of the well region 2, as illustrated in FIG. 1D. The unit semiconductor chips 700a, 700b, 700c, 700d, 700e, 700f, 700g, and 700h and the boundary region 80 may share a semiconductor substrate 1 of the one-body type.

Figure 9A:
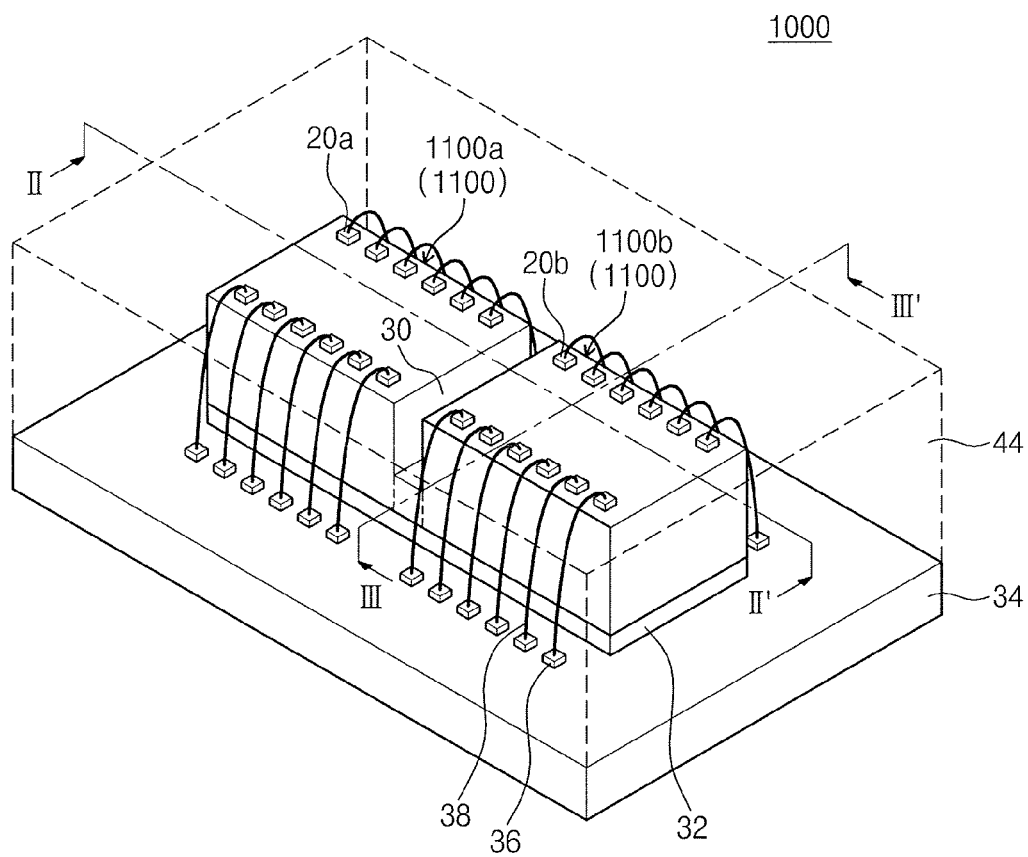
FIG. 9A is a perspective view illustrating a semiconductor package according to exemplary embodiments of the present inventive concept.
Figure 9B:
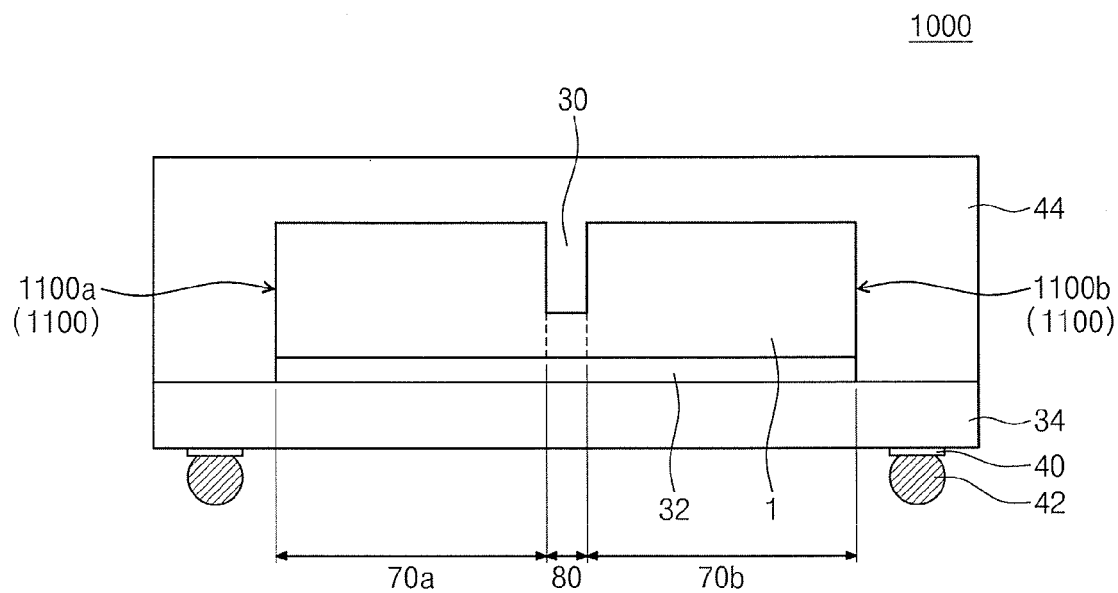
FIGS. 9B and 9C are cross-sectional views of FIG. 9A.
Figure 9C:
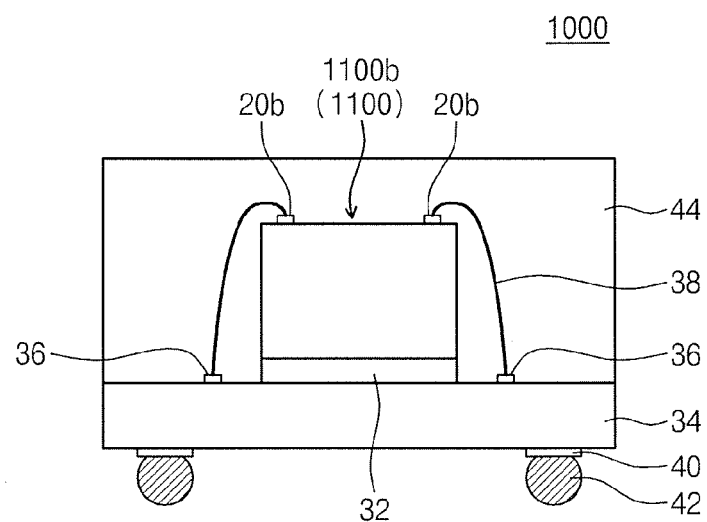

FIGS. 9A to 9C are a perspective view and cross-sectional views illustrating a semiconductor package 1000 according to exemplary embodiments of the present inventive concept.

FIG. 9A is a perspective view of the semiconductor package 1000, FIG. 9B is a cross-sectional view of the semiconductor package 1000 taken along a line II-II' of FIG. 9A, and FIG. 9C is a cross-sectional view of the semiconductor package 1000 taken along a line III-III' of FIG. 9A.

Referring to FIGS. 9A to 9C, a semiconductor chip 1100 may be mounted on a package substrate 34. For example, the semiconductor chip 1100 may be the semiconductor chip 100 described with reference to FIGS. 1A to 1D. Alternatively, the semiconductor chip 1100 may be one of the semiconductor chips 120, 140, 160, 180, 200, 300, 400, 500, 600, and 700 described with reference to FIGS. 2A to 2D, 3A to 8A and 3B to 8B.

The package substrate 34 may include a printed circuit board (PCB). A die attach film (DAF) 32 used as an adhesive member may be provided between the package substrate 34 and the semiconductor chip 1100.

Chip pads 20a and 20b disposed on top surfaces of chip regions 70a and 70b of unit semiconductor chips 1100a and 1100b, respectively, may be electrically connected to substrate pads 36 disposed on the package substrate 34 through conductive wires 38. Lower substrate bump pads 40 and substrate bumps 42 may be disposed on a bottom surface of the package substrate 34. The lower substrate bump pads 40 may be electrically connected to the substrate pads 36. The substrate bumps 42 may be electrically connected to a mother board or a module board, for example. A molding member 44 may be formed on the package substrate 34 to cover the semiconductor chip 1100 and the conductive wires 38. The molding member 44 may protect the semiconductor chip 1100 and the conductive wires 38 from an external environment. The molding member 44 may include an epoxy molding compound (EMC). The molding member 44 on the package substrate 34 may fill at least a portion of a groove 30 formed in a boundary region 80 between the unit semiconductor chips 1100a and 1100b. For example, an upper portion of the groove 30 may be filled with the molding member 44, and an air gap may be provided in a lower portion of the groove 30. The groove 30 may be completely filled with the molding member 44.

In processes of mounting the semiconductor chip 1100 on the package substrate 34 and assembling the semiconductor package 1000, warpage of the semiconductor chip 1100 may be inhibited by the groove 30 in the boundary region 80, so that damage caused by lift-off of an edge of the semiconductor chip 1100 may be prevented. The unit semiconductor chips 1100a and 1100b and the boundary region 80 may share a semiconductor substrate 1 of the one-body type.

Figure 10A:
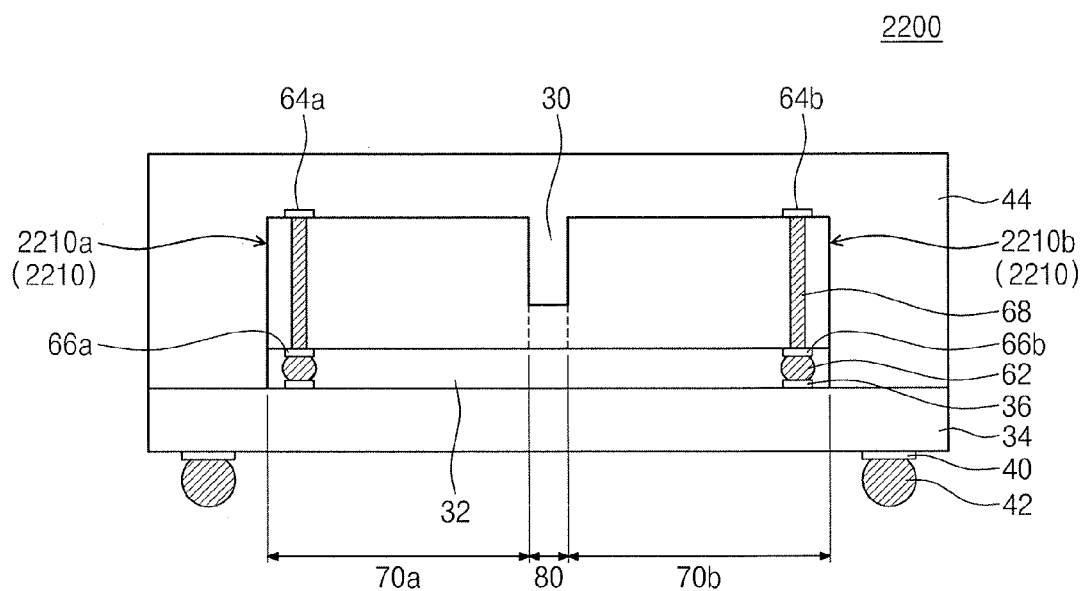
FIGS. 10A to 10C are cross-sectional views illustrating semiconductor packages according to exemplary embodiments of the present inventive concept.
Figure 10B:
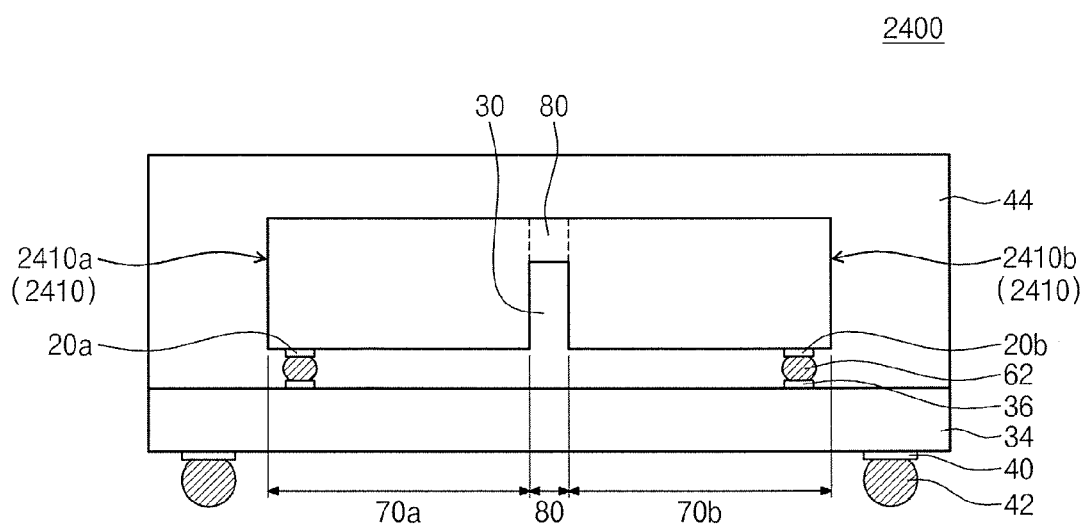
Figure 10C:
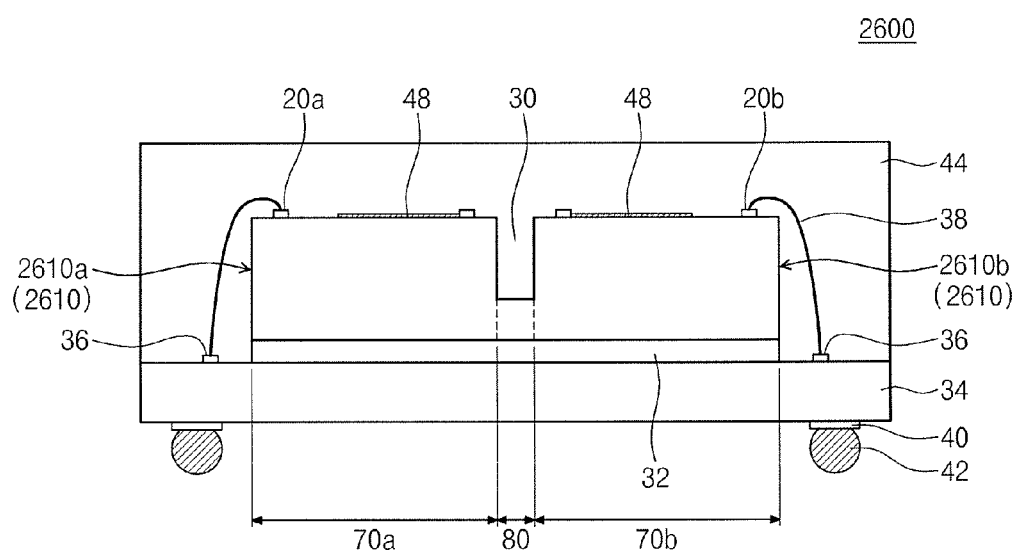

FIGS. 10A to 10C are cross-sectional views illustrating semiconductor packages 2200, 2400, and 2600 according to exemplary embodiments of the present inventive concept.

Referring to FIG. 10A, a semiconductor package 2200 according to exemplary embodiments of the present inventive concept may include a semiconductor chip 2210. The semiconductor chip 2210 may be applied with a through-via 68 and may be mounted on a package substrate 34. For example, the semiconductor chip 2210 may be manufactured by applying through-vias 68 to the semiconductor chip 100 described with reference to FIGS. 1A to 1D. The semiconductor chip 2210 may be manufactured by applying through-vias 68 to one of the semiconductor chips 120, 140, 160, 180, 200, 300, 400, 500, 600, and 700 described with reference to FIGS. 2A to 2D, 3A to 8A and 3B to 8B. Upper chip bump pads 64a and 64b may be disposed on top surfaces of chip regions 70a and 70b of the semiconductor chip 2210. The upper chip bump pads 64a and 64b may be the chip pads. Lower chip bump pads 66a and 66b may be disposed on bottom surfaces of the chip regions 70a and 70b of the semiconductor chip 2210. The semiconductor chip 2210 may include through-vias 68 that penetrate the semiconductor chip 2210 to electrically connect the upper chip bump pads 64a and 64b to the lower chip bump pads 66a and 66b, respectively. Substrate pads 36 may be disposed on a top surface of the package substrate 34. Lower substrate bump pads 40 may be disposed on a bottom surface of the package substrate 34. Chip bumps 62 may be provided between the lower chip bump pads 66a and 66b and the substrate pads 36, such that the semiconductor chip 2210 may be electrically connected to the package substrate 34. Substrate bumps 42 may be bonded to the lower substrate bump pads 40. An adhesive member 32 may be formed between the package substrate 34 and the semiconductor chip 2210. The adhesive member 32 may include an underfill material, a molding material, and/or a die attach film, for example. A molding member 44 may fill at least a portion of the groove 30 formed in a boundary region 80 between unit semiconductor chips 2210a and 2210b. For example, an upper portion of the groove 30 may be filled with the molding member 44, and an air gap may be provided in a lower portion of the groove 30. The groove 30 may be completely filled with the molding member 44.

Referring to FIG. 10B, a semiconductor package 2400 according to exemplary embodiments of the present inventive concept may include a semiconductor chip 2410 applied with chip bumps 62 and mounted on a package substrate 34. For example, the semiconductor chip 2410 may be the semiconductor chip 100 described with reference to FIGS. 1A to 1D. The semiconductor chip 2410 may be one of the semiconductor chips 120, 140, 160, 180, 200, 300, 400, 500, 600, and 700 described with reference to FIGS. 2A to 2D, 3A to 8A and 3B to 8B.

Chip pads 20a and 20b may be disposed, facing substrate pads 36. Each of the chip pads 20a and 20b may be electrically connected to each of the substrate pads 36 through each of the chip bumps 62. A molding member 44 may fill at least a portion of the groove 30 formed in a boundary region 80 between unit semiconductor chips 2410a and 2410b. For example, an upper portion of the groove 30 may be filled with the molding member 44, and an air gap may be provided in a lower portion of the groove 30. The groove 30 may be completely filled with the molding member 44. In one or more exemplary embodiments of the present invention, a material filling the groove 30 may be an underfill material.

Referring to FIG. 10C, a semiconductor package 2600 according to exemplary embodiments of the present inventive concept may include a semiconductor chip 2610 applied with redistribution lines 48. For example, the semiconductor chip 2610 may be the semiconductor chip 180 described with reference to FIG. 2D. The semiconductor chip 2610 may be formed by applying the redistribution lines 48 to one of the semiconductor chips 200, 300, 400, 500, 600, and 700 described with reference to FIGS. 3A to 8A and 3B to 8B.

Chip pads 20a and 20b may be disposed on top surfaces of unit semiconductor chips 2610a and 2610b. The chip pads 20a and 20b disposed at sides adjacent to a groove 30 may be connected to the redistribution lines 48. The chip pads 20a and 20b disposed at sides opposite to the groove 30 may be electrically connected to substrate pads 32 of the package substrate 34 through conductive wires 38. A molding member 44 may fill at least a portion of the groove 30. For example, an upper portion of the groove 30 may be filled with the molding member 44, and an air gap may be provided in a lower portion of the groove 30. The groove 30 may be completely filled with the molding member 44.

Figure 11A:
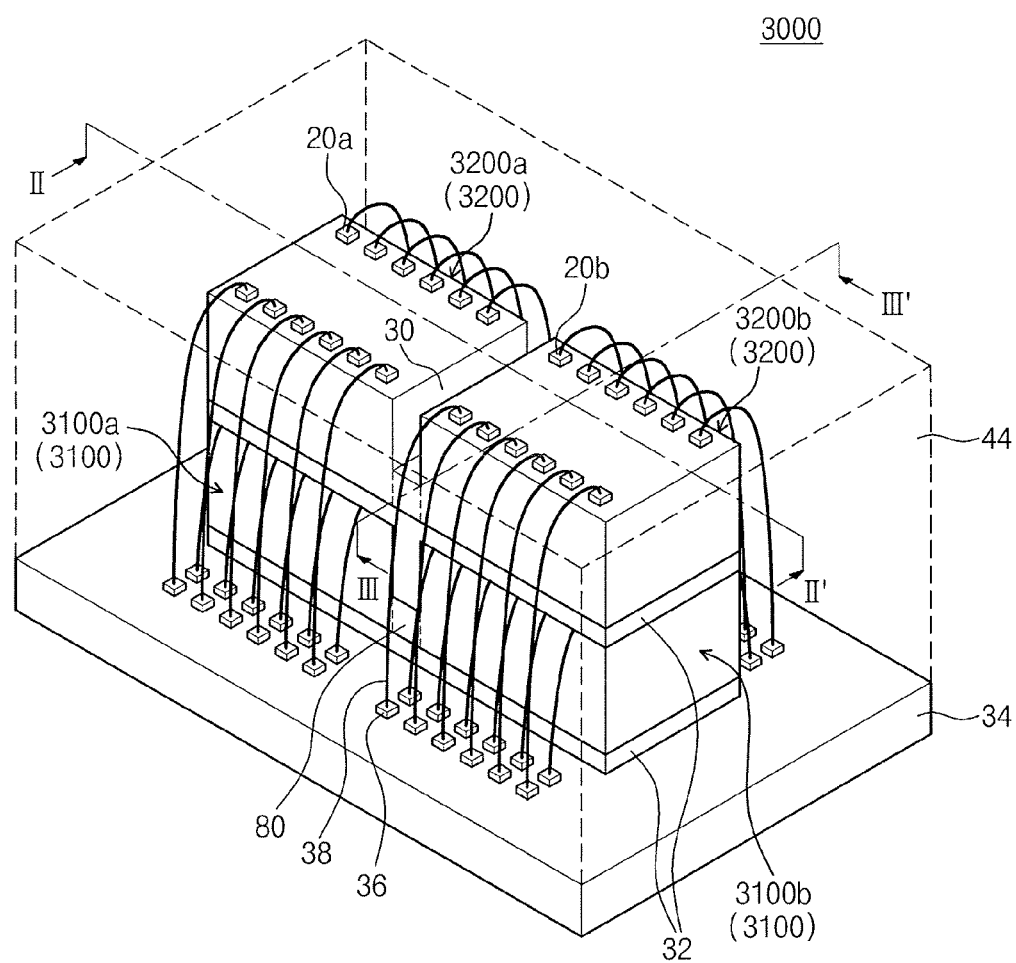
FIGS. 11A, 12A and 13A are perspective views illustrating semiconductor packages having stack semiconductor chips according to exemplary embodiments of the present inventive concept.
Figure 11B:
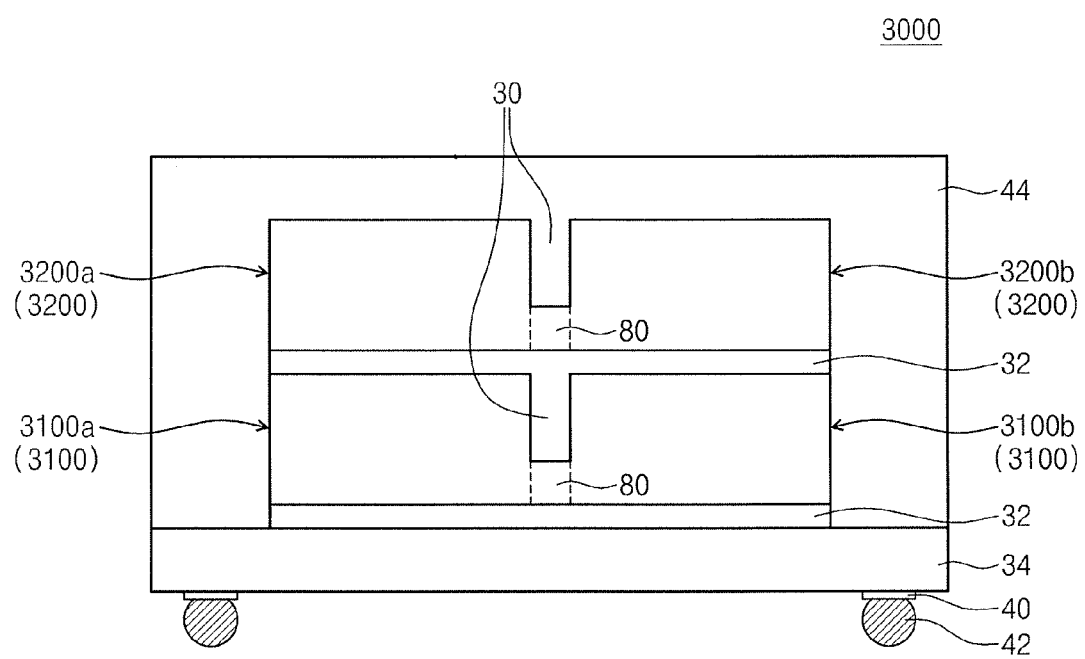
FIGS. 11B, 12B and 13B and 11C, 12C and 13C are cross-sectional views of FIGS. 11A, 12A and 13A, respectively.

FIG. 11A is a perspective view of a semiconductor package 3000 according to exemplary embodiments of the present inventive concept. FIG. 11B is a cross-sectional view taken along a line II-II' of FIG. 11A, and FIG. 11C is a cross-sectional view taken along a line III-III' of FIG. 11A.

Figure 11C:
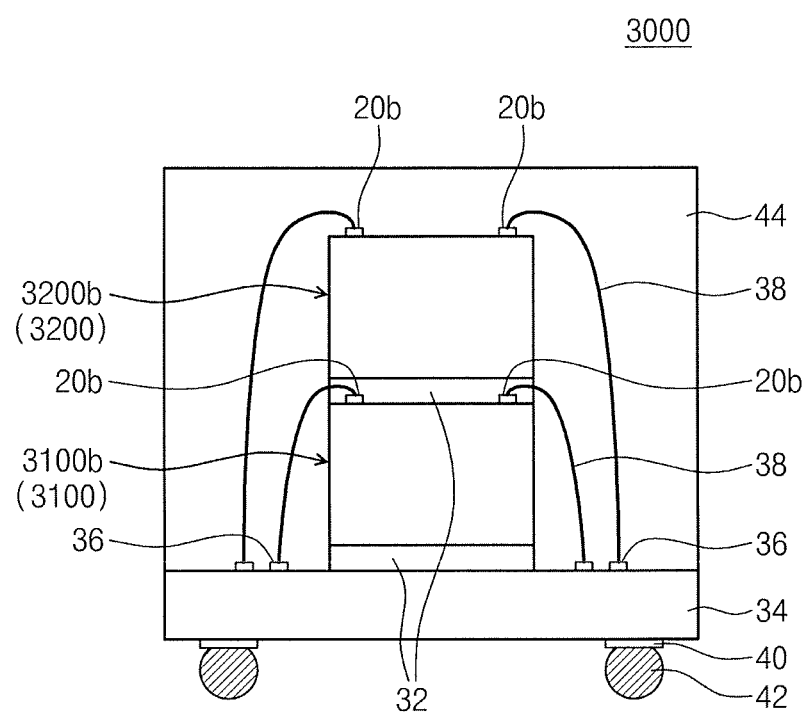

Referring to FIGS. 11A to 11C, the semiconductor package 3000 according to exemplary embodiments of the present inventive concept may be a stack semiconductor chip package. For example, the semiconductor package 3000 may include a lower semiconductor chip 3100 and an upper semiconductor chip 3200 that are sequentially stacked on a package substrate 34. The lower semiconductor chip 3100 may include two unit semiconductor chips 3100a and 3100b. The unit semiconductor chips 3100a and 3100b may be divided by a boundary region 80 in which a groove 30 may be formed. The upper semiconductor chip 3200 may include two unit semiconductor chips 3200a and 3200b. The unit semiconductor chips 3200a and 3200b may be divided by a boundary region 80 in which a groove 30 may be formed. Each of the semiconductor chips 3100 and 3200 may be the semiconductor chip 100 described with reference to FIGS. 1A to 1D. Each of the semiconductor chips 3100 and 3200 may be one of the semiconductor chips 120, 140, 160, 180, 200, 300, 400, 500, 600, and 700 described with reference to FIGS. 2A to 2D, 3A to 8A and 3B to 8B. The unit semiconductor chips 3100a and 3100b and the boundary region 80 of the lower semiconductor chip 3100 may share a semiconductor substrate of the one-body type. The unit semiconductor chips 3200a and 3200b and the boundary region 80 of the upper semiconductor chip 3200 may share a semiconductor substrate of the one-body type.

The package substrate 34 may include a PCB. Adhesive members 32 may be disposed between the package substrate 34 and the lower semiconductor chip 3100 and between the lower semiconductor chip 3100 and the upper semiconductor chip 3200, respectively. The adhesive members 32 may be a DAF. The die attack film may include an adhesive resin, for example. The groove 30 formed in the boundary region 80 may inhibit edges of the semiconductor chips 3100 and 3200 from lifting off from the package substrate 34 in a mounting process of the semiconductor package. Thus, a yield and reliability of the semiconductor package may be increased. Chip pads 20a and 20b may be formed on top surfaces of the unit semiconductor chips 3100a, 3100b, 3200a, and 3200b. The chip pads 20a and 20b may be electrically connected to substrate pads 36 disposed on the package substrate 34 through conductive wires 38.

Lower substrate bump pads 40 and substrate bumps 42 may be disposed on a bottom surface of the package substrate 34. The lower substrate bump pads 40 may be electrically connected to the substrate pads 36. The substrates bumps 42 may be electrically connected to a mother board or a module board. A molding member 44 may be formed on the package substrate 34 to cover the semiconductor chips 3100 and 3200 and the conductive wires 38. The molding member 44 may protect the semiconductor chips 3100 and 3200 and the conductive wires 38 from an external environment. The molding member 44 may include an EMC.

The molding member 44 may fill at least a portion of the groove 30. For example, an upper portion of the groove 30 of the upper semiconductor chip 3200 may be filled with the molding member 44, and an air gap may be provided in a lower portion of the groove 30 of the upper semiconductor chip 3200. The groove 30 of the upper semiconductor chip 3200 may be completely filled with the molding member 44. The adhesive member 32 between the upper and lower semiconductor chips 3200 and 3100 may fill at least a portion of the groove 30 formed in the lower semiconductor chip 3100. An upper portion of the groove 30 of the lower semiconductor chip 3100 may be filled with the adhesive member 32, and an air gap may be provided in a lower portion of the groove 30 of the lower semiconductor chip 3100. The groove 30 of the lower semiconductor chip 3100 may be completely filled with the adhesive member 32. The boundary regions 80 of the semiconductor chips 3100 and 3200 may be vertically aligned with each other. Two semiconductor chips 3100 and 3200 stacked on the package substrate 34 are illustrated in FIGS. 11A to 11C. However, the present inventive concept is not limited thereto. In one or more exemplary embodiments of the present invention, three or more semiconductor chips may be stacked on the package substrate 34.

Figure 12A:
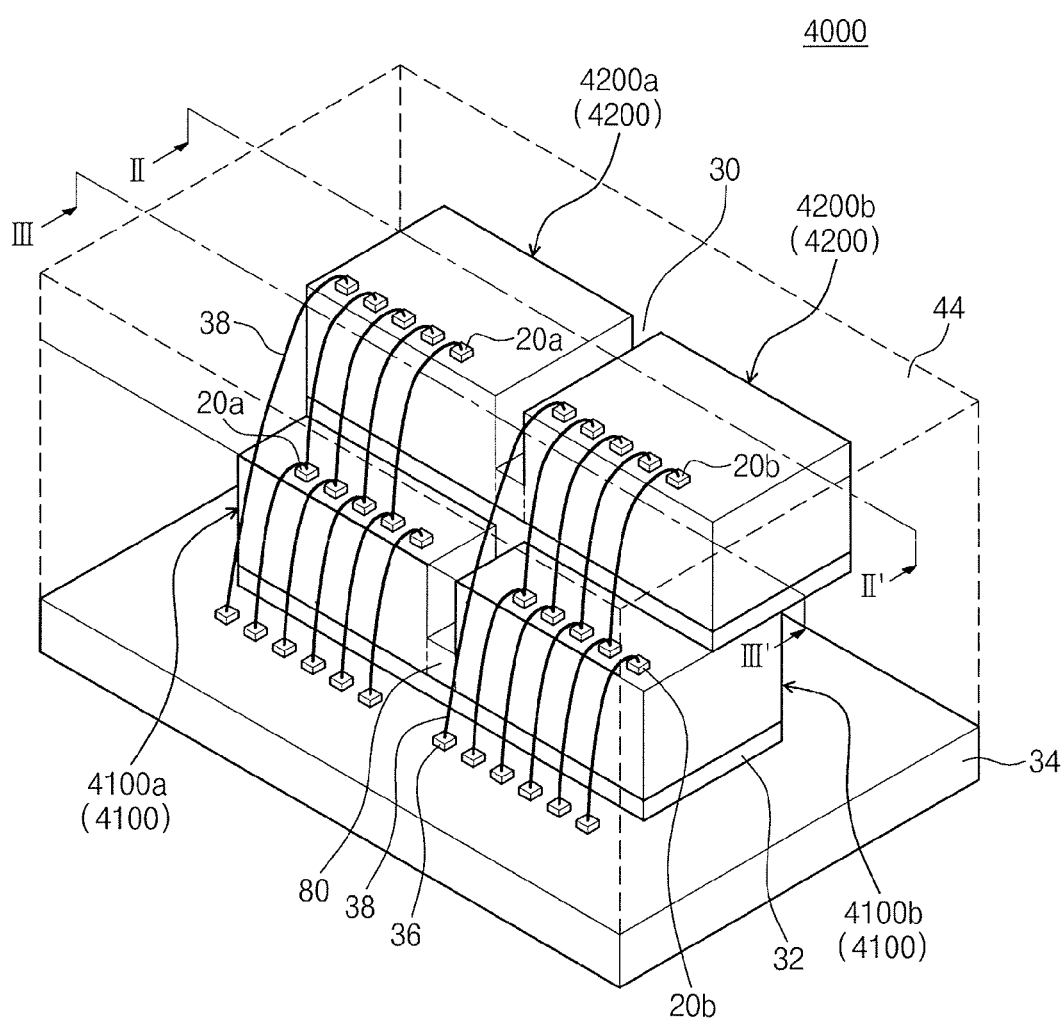
Figure 12B:
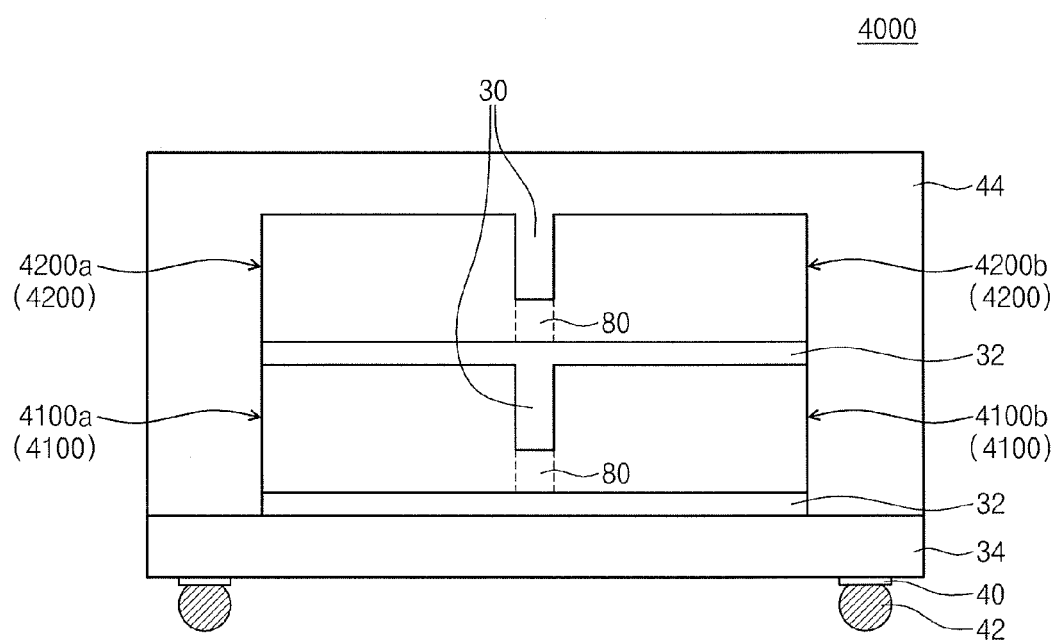

FIG. 12A is a perspective view of a semiconductor package 4000 according to exemplary embodiments of the inventive concept. FIG. 12B is a cross-sectional view taken along a line II-II' of FIG. 12A, and FIG. 12C is a cross-sectional view taken along a line III-III' of FIG. 12A.

Figure 12C:
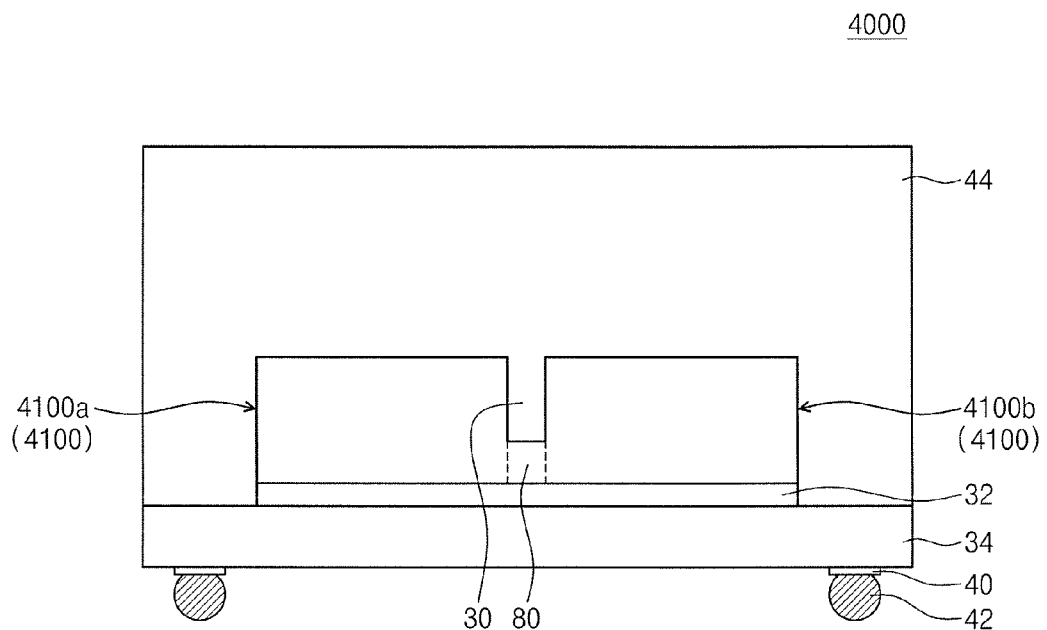

Referring to FIGS. 12A to 12C, the semiconductor package 4000 according to exemplary embodiments of the inventive concept may be a cascade type stack semiconductor chip package. Each of semiconductor chips 4100 and 4200 may be the semiconductor chip 100 described with reference to FIGS. 1A to 1D. Each of the semiconductor chips 4100 and 4200 may be one of the semiconductor chips 120, 140, 160, 180, 200, 300, 400, 500, 600, and 700 described with reference to FIGS. 2A to 2D, 3A to 8A and 3B to 8B. The semiconductor chips 4100 and 4200 may be stacked in cascade form such that a portion of a top surface of the lower semiconductor chip 4100 is exposed. Thus, the semiconductor package 4000 may have an overlapping region of the semiconductor chips 4100 and 4200 and a non-overlapping region of the semiconductor chips 4100 and 4200.

As illustrated in FIG. 12B, an adhesive member 32 may fill at least a portion of a groove 30 in a boundary region 80 between unit semiconductor chips 4100a and 4100b of the lower semiconductor chip 4100 in the overlapping region. For example, an upper portion of the groove 30 of the lower semiconductor chip 4100 in the overlapping region may be filled with the adhesive member 32, and an air gap may be provided in a lower portion of the groove 30 of the lower semiconductor chip 4100 in the overlapping region. The groove 30 of the lower semiconductor chip 4100 in the overlapping region may be completely filled with the adhesive member 32.

As illustrated in FIG. 12C, a molding member 44 may fill at least a portion of the groove 30 formed in the boundary region 80 between the unit semiconductor chips 4100a and 4100b of the lower semiconductor chip 4100 in the non-overlapping region. The molding member 44 may also fill at least a portion of a groove 300 formed in a boundary region 80 between unit semiconductor chips 4200a and 4200b of the upper semiconductor chip 4200. For example, an upper portion of the groove 30 of the upper semiconductor chip 4200 may be filled with the molding member 44, and an air gap may be provided in a lower portion of the groove 30 of the upper semiconductor chip 4200. The groove 30 of the upper semiconductor chip 4200 may be completely filled with the molding member 44.

Chip pads 20a and 20b may be formed on top surfaces of the semiconductor chips 4100 and 4200. The chip pads 20a and 20b may be disposed to be adjacent to one-side of the unit semiconductor chips 4100a, 4100b, 4200a, and 4200b, which cross an extending direction of the groove 30. The chip pads 20a and 20b of the semiconductor chips 4100 and 4200 may be electrically connected to substrate pads 36 through conductive wires 38. At least some of the chip pads 20a and 20b of the upper semiconductor chip 4200 may be electrically connected to at least some of the chip pads 20a and 20b of the lower semiconductor chip 4100 through some of the conductive wires 38. Two stacked semiconductor chips 4100 and 4200 are illustrated in FIGS. 12A to 12C. However, the present inventive concept is not limited thereto. In one or more exemplary embodiments of the present inventive concept, three or more semiconductor chips may be stacked on the package substrate 34.

Figure 13A:
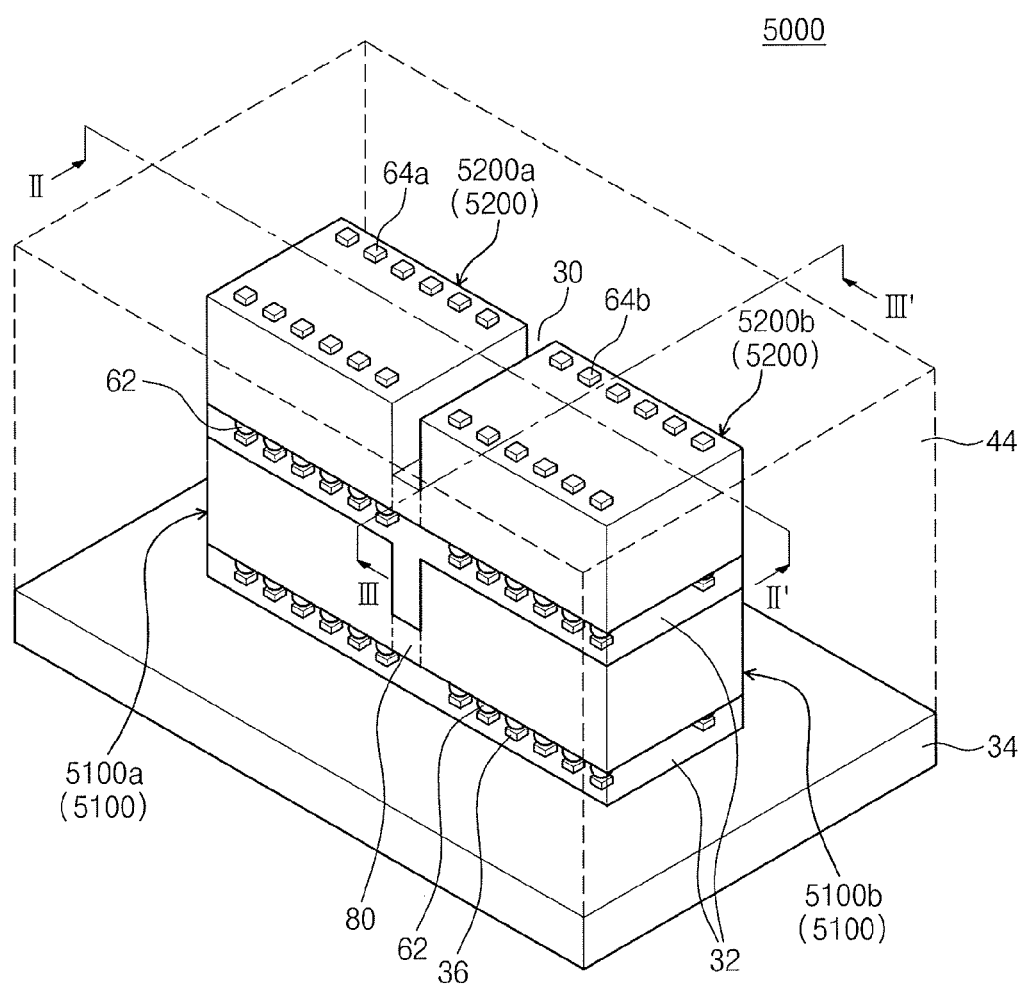
Figure 13B:
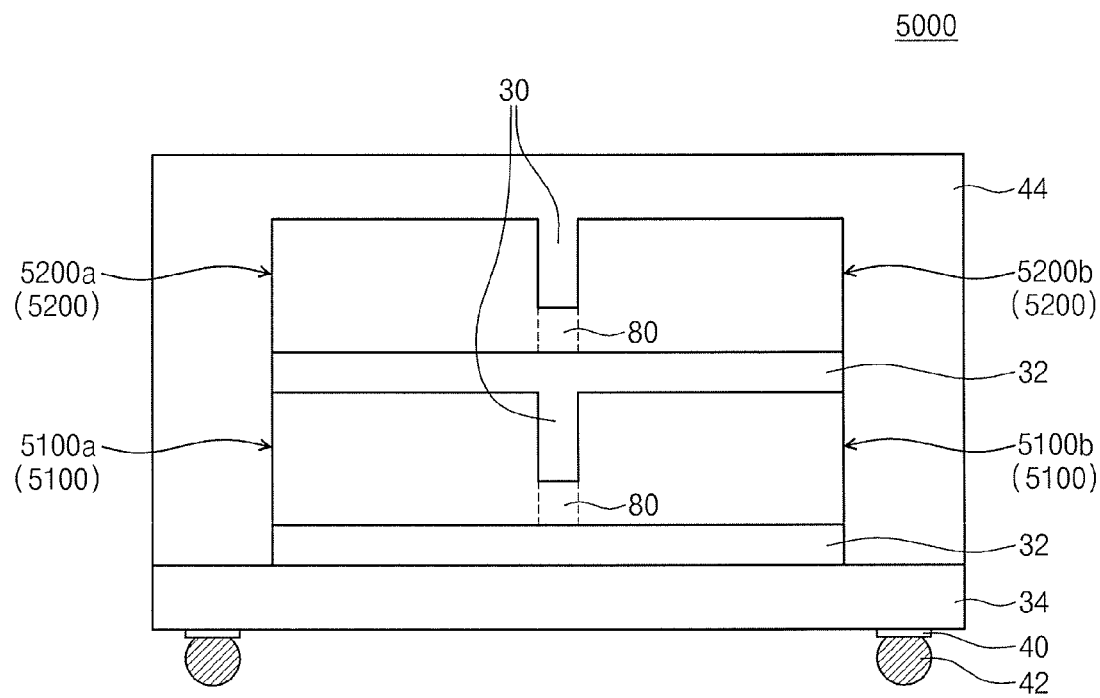

FIG. 13A is a perspective view of a semiconductor package 5000 according to exemplary embodiments of the inventive concept. FIG. 13B is a cross-sectional view taken along a line II-II' of FIG. 13A, and FIG. 13C is a cross-sectional view taken along a line III-III' of FIG. 13A.

Figure 13C:
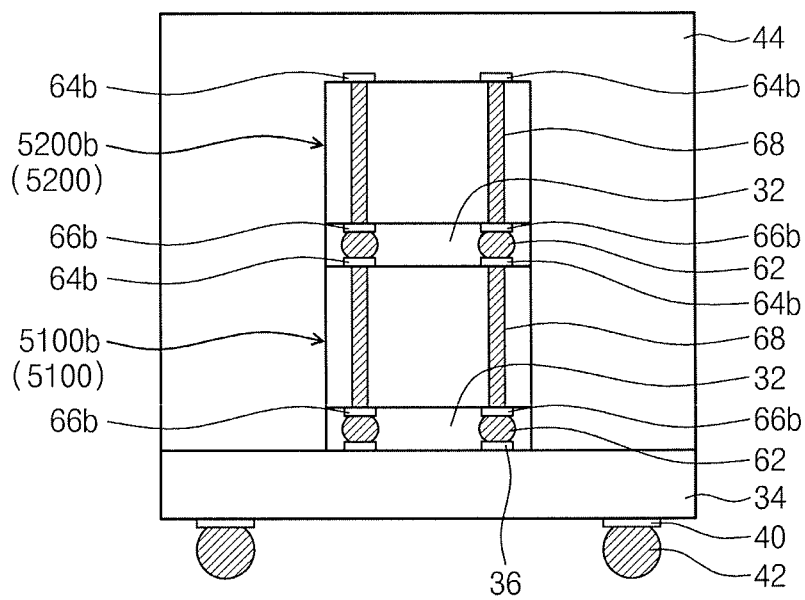

Referring to FIGS. 13A to 13C, the semiconductor package 5000 according to exemplary embodiments of the present inventive concept may be a stack semiconductor chip package including through-vias 68. Each of semiconductor chips 5100 and 5200 according to the present exemplary embodiment may be the same as the semiconductor chip 2210 described with reference to FIG. 10A, for example.

The semiconductor chips 5100 and 5200 may include chip bumps 62 disposed to be adjacent to at least one side of each of unit semiconductor chips 5100a, 5100b, 5200a, and 5200b. The semiconductor chips 5100 and 5200 may include the through-vias 68. The chip bumps 62 may be connected to chip bump pads 64a, 64b, 66a (not shown), and 66b and may be electrically connected to the through-vias 68. Adhesive members 32 may be formed between a package substrate 34 and the lower semiconductor chip 5100 and between the semiconductor chips 5100 and 5200. The adhesive members 32 may include an underfill material, a molding material, and/or a DAF. The lower semiconductor chip 5100 may be electrically connected to substrate pads 36 through the chip bumps 62 under the lower semiconductor chip 5100. The substrate pads 36 may be electrically connected to lower substrate bump pads 40 and substrate bumps 42.

A molding member 44 formed on the package substrate 34 may fill at least a portion of a groove 30 formed in a boundary region 80 of the upper semiconductor chip 5200. For example, an upper portion of the groove 30 of the upper semiconductor chip 5200 may be filled with the molding member 44, and an air gap may be provided in a lower portion of the groove 30 of the upper semiconductor chip 5200. The groove 30 of the upper semiconductor chip 5200 may be completely filled with the molding member 44. The adhesive member 32 between the upper and lower semiconductor chips 5200 and 5100 may fill at least a portion of a groove 30 formed in the lower semiconductor chip 5100. An upper portion of the groove 30 of the lower semiconductor chip 5100 may be filled with the adhesive member 32, and an air gap may be provided in a lower portion of the groove 30 of the lower semiconductor chip 5100. The groove 30 of the lower semiconductor chip 5100 may be completely filled with the adhesive member 32. Two stacked semiconductor chips 5100 and 5200 are illustrated in FIGS. 13A to 13C. However, the present inventive concept is not limited thereto. In one or more exemplary embodiments of the present inventive concept, three or more semiconductor chips may be stacked on the package substrate 34 of FIGS. 13A to 13C.

Figure 14:
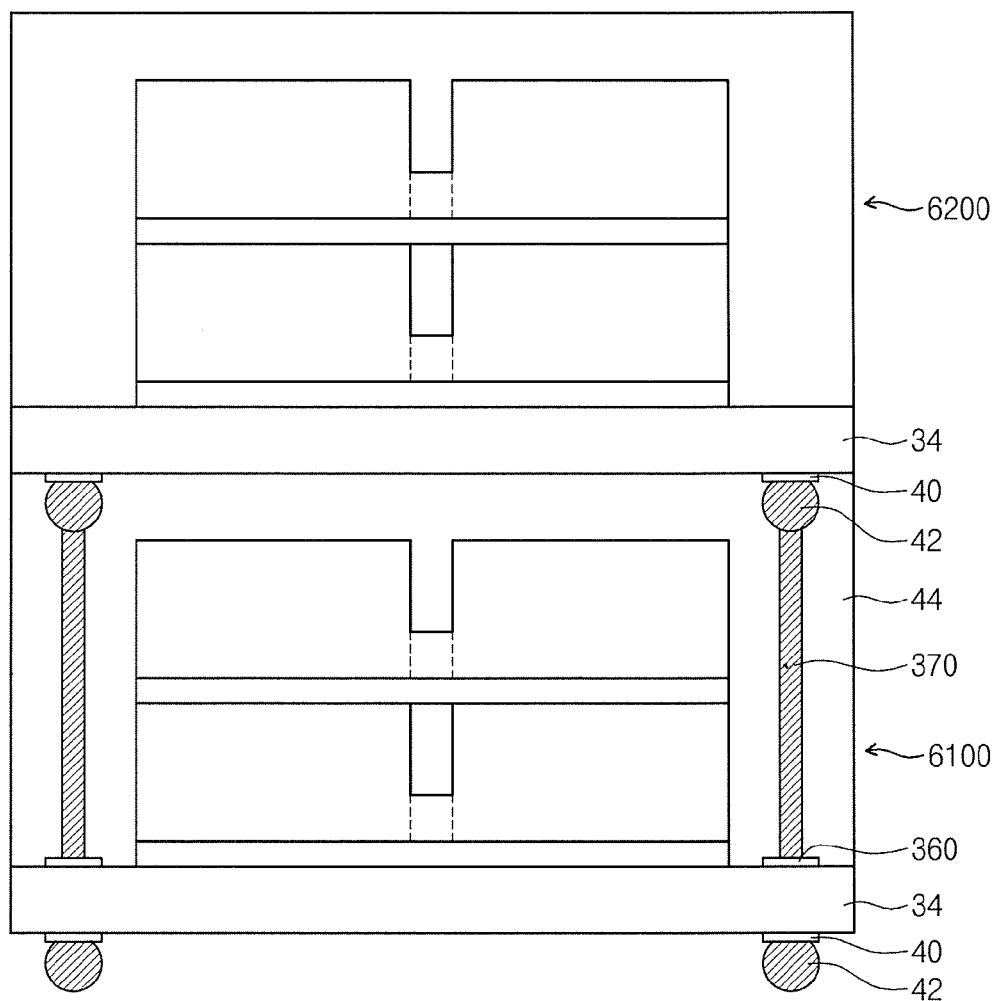
FIG. 14 is a cross-sectional view illustrating a package-on-package structure according to exemplary embodiments of the present inventive concept.

FIG. 14 is a cross-sectional view of a semiconductor package 6000 according to exemplary embodiments of the inventive concept.

Referring to FIG. 14, the semiconductor package 6000 according to exemplary embodiments of the inventive concept may include a package-on-package structure including sequentially stacked packages 6100 and 6200. At least one of the packages 6100 and 6200 may be one of the semiconductor packages 1000, 2200, 2400, 2600, 3000, 4000, or 5000 described with reference to FIGS. 9A to 9C, 10A to 10C, 11A to 11C, 12A to 12C, and 13A to 13C. Two stacked packages are illustrated in FIG. 14. However, the inventive concept is not limited thereto. In one or more exemplary embodiments of the present invention, three or more packages may be stacked.

Substrate bumps 42 may be connected to lower substrate bump pads 40 of the upper package 6200. The substrate bumps 42 may be disposed in a molding member 44 of the lower package 6100. The substrate bumps 42 of the upper package 6200 may be connected to conductive pillar members 370. The conductive pillar members 370 may pass through the molding member 44 of the lower package 6100. The substrate bumps 42 of the upper package 6200 may be electrically connected to upper substrate bump pads 360 of the lower package 6100 through the conductive pillar members 370. The upper substrate bump pads 360 of the lower package 6100 may be electrically connected to lower substrate bump pads 40 and substrate bumps 42 of the lower package 6100. The conductive pillar member 370 may include a solder ball.

Figure 15A:
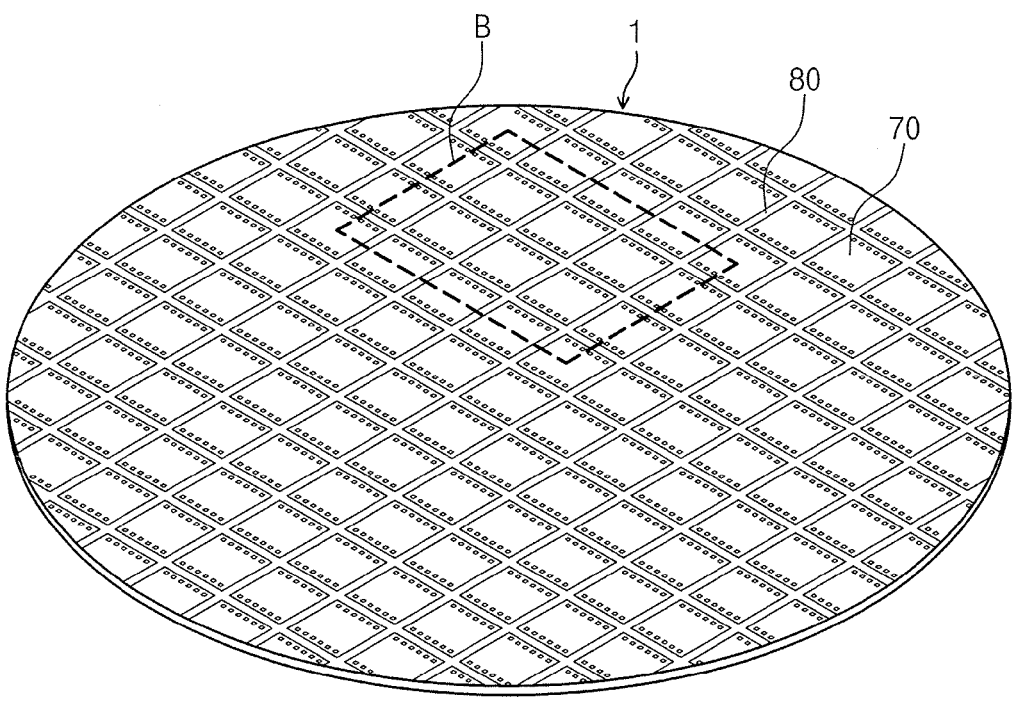
FIG. 15A is a plan view illustrating a semiconductor substrate on which semiconductor chips according to exemplary embodiments of the present inventive concept are formed.
Figure 15B:
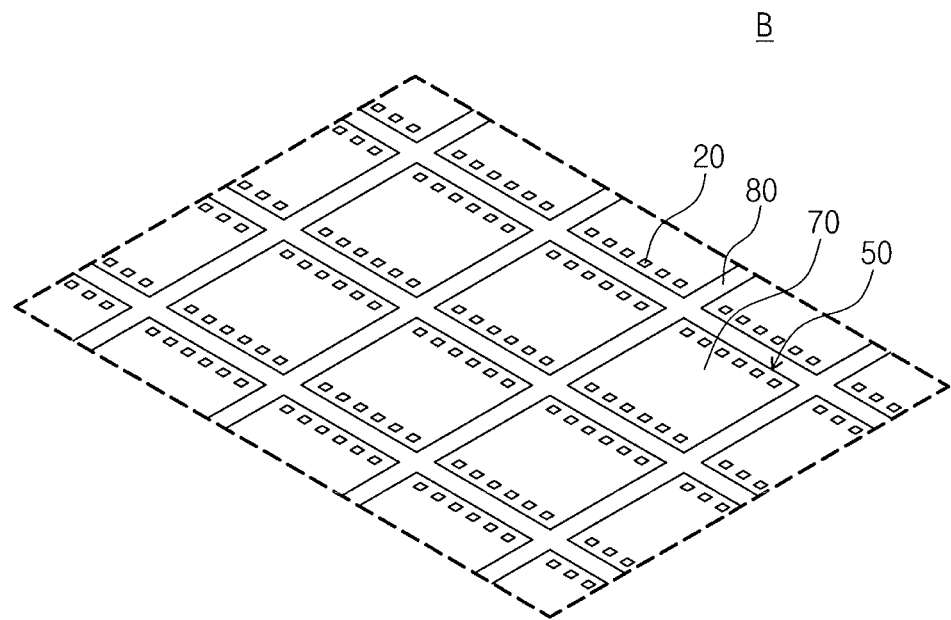
FIG. 15B is an enlarged view of a portion 'B' of FIG. 15A.

FIG. 15A is a plan view illustrating a semiconductor substrate on which semiconductor chips according to exemplary embodiments of the present inventive concept are formed, and FIG. 15B is an enlarged view of a portion 'B' of FIG. 15A.

Referring to FIGS. 15A and 15B, a semiconductor substrate 1 may include chip regions 70 constituting unit semiconductor chips 50 and a boundary region 80 between the chip regions 70. The boundary region 80 may be, for example, a scribe lane. The chip regions 70 may be two-dimensionally arranged in a matrix type on a front side of the semiconductor substrate 1. Each of the chip regions 70 may be surrounded by the boundary region 80. Each of the chip regions 70 may have a pair of long sides parallel to each other and a pair of short sides parallel to each other.

The semiconductor integrated circuits described with reference to FIGS. 1A and 1D may be formed on the chip regions 70 of the semiconductor substrate 1 through one or more semiconductor manufacture processes. The semiconductor integrated circuits may be electrically connected to external electronic devices through chip pads 20. In exemplary embodiments of the present inventive concept, the chip pads 20 may be arranged to be adjacent to the boundary region 80.

A bottom surface of the semiconductor substrate 1 may be grinded such that the semiconductor substrate 1 may be thinned to have a thickness in a range of, for example, about 30 μm to about 600 μm.

Figure 16:
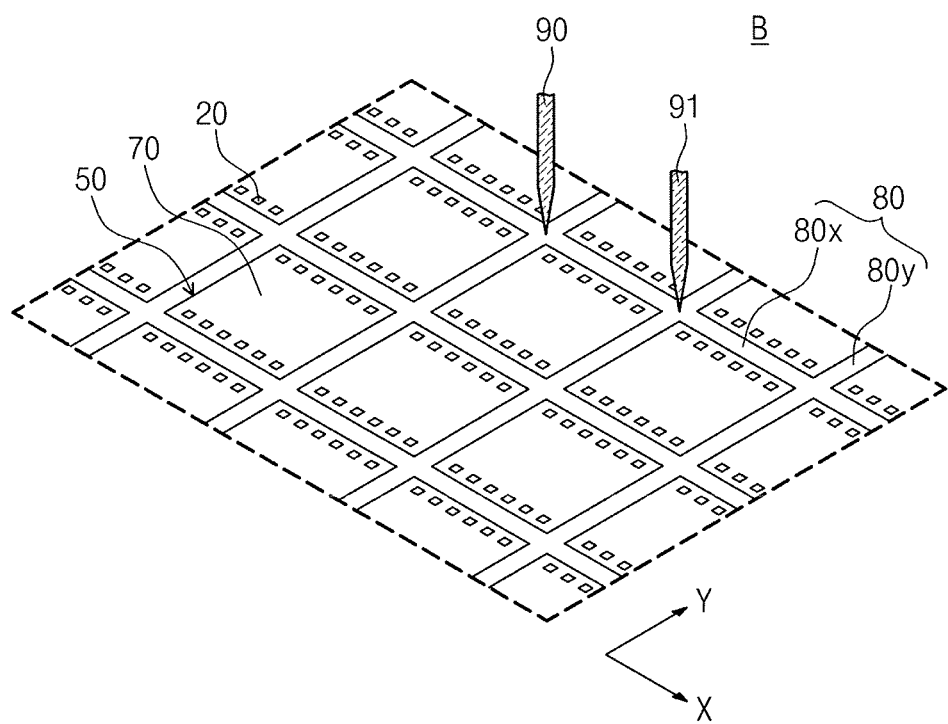
FIG. 16 is a plan view illustrating a process of forming semiconductor chips according to exemplary embodiments of the present inventive concept.
Figure 17A:
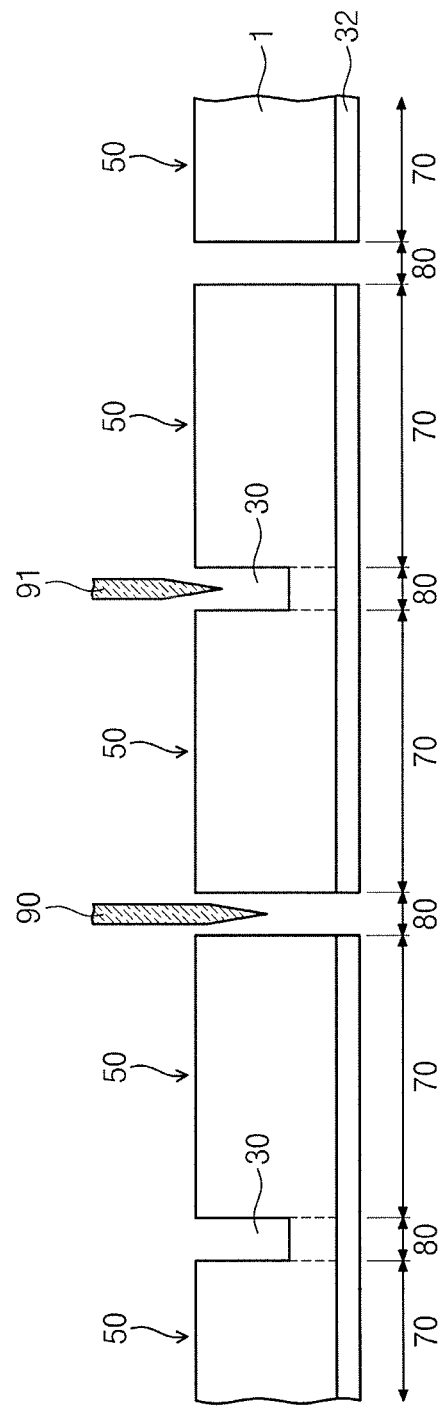

FIG. 16 is a plan view illustrating a process of forming semiconductor chips according to exemplary embodiments of the inventive concept, and FIGS. 17A and 17B are cross-sectional views of FIG. 16.

Referring to FIGS. 16, 17A, and 17B, an adhesive member 32 may be provided on a back side of a grinded semiconductor substrate 1 to form a semiconductor chip according to exemplary embodiments of the present inventive concept. Sawing blades 90 and 91 may be used to form the semiconductor chip according to exemplary embodiments of the present inventive concept, for example, the semiconductor chip 100 described with reference to FIGS. 1A to 1D. A first sawing blade 90 and a second sawing blade 91 may be disposed on one or more Y-directional boundary regions 80y. The first sawing blade 90 and a second sawing blade 91 may be spaced apart from each other by an interval of a size of one unit semiconductor chip 50 in an X-direction. The first and second sawing blades 90 and 91 may be moved in a Y-direction to saw the semiconductor substrate 1. A sawing depth of the first sawing blade 90 may be configured to cut the semiconductor substrate 1 and the adhesive member 32. A sawing depth of the second sawing blade 91 may be configured to not physically separate adjacent unit semiconductor chips 50 from each other. A sawing depth of the second sawing blade 91 may be configured to electrically separate the adjacent unit semiconductor chips 50 from each other. For example, the sawing depth of the second sawing blade 91 may be deeper than the well region 2 formed in the chip region 70 illustrated in FIG. 1D. A groove 30 corresponding to a recess region may be formed in the boundary region 80 between the unit semiconductor chips 50.

Referring to FIGS. 16 and 17B, the first sawing blade 90 and the second sawing blade 91 may be disposed on X-directional boundary regions 80x. The first sawing blade 90 and the second sawing blade 91 may be spaced apart from each other by an interval of a size of one unit semiconductor chip 50 in the Y-direction. The first sawing blade 90 and the second sawing blade 91 may be disposed in the X-directional boundary region 80x after the Y directional boundary regions 80y are sawn. The first and second sawing blades 90 and 91 may be moved in the X-direction to cut the semiconductor substrate 1 and the adhesive member 32. Thus, the semiconductor chips of which each includes the unit semiconductor chips 50 divided by the boundary region 80 having the groove 30 may be individually separated from each other.

Figure 18A:
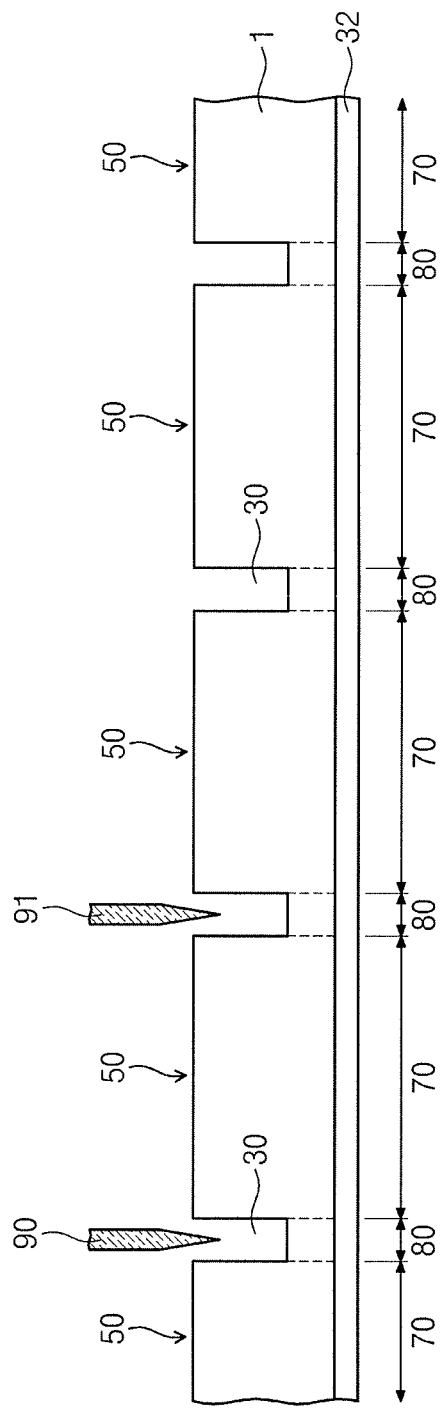
Figure 18B:
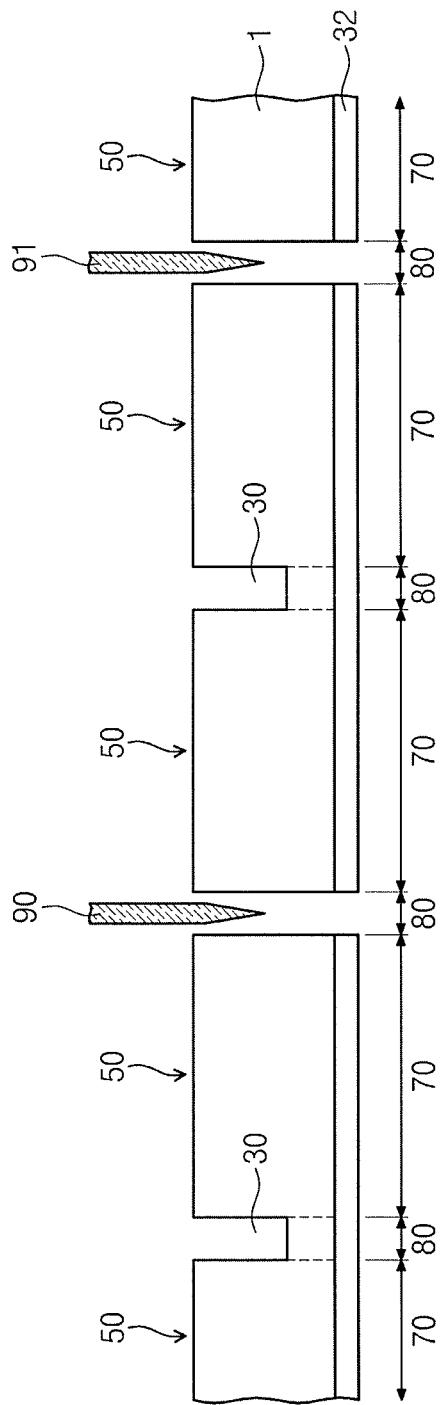

FIGS. 18A to 18C are cross-sectional views illustrating a process of forming semiconductor chips according to exemplary embodiments of the inventive concept.

Referring to FIGS. 16 and 18A, first, the Y-directional boundary regions 80y may be sawn using the first and second sawing blades 90 and 91. A sawing depth may be a depth configured to not physically separate adjacent unit semiconductor chips 50 from each other but to electrically separate the adjacent unit semiconductor chips 50 from each other. For example, the sawing depth may be deeper than the well region 2 formed in the chip region 70 illustrated in FIG. 1D. Thus, a groove 30 being a recess region may be formed in the boundary region 80 of the unit semiconductor chips 50. In exemplary embodiments of the present inventive concept, the groove 30 may be formed using a laser.

Referring to FIGS. 16 and 18B, the semiconductor substrate 1 and the adhesive member 32 of some of the Y-directional boundary regions 80y may be cut using the first and second sawing blades 90 and 91 such that a semiconductor chip including two united unit semiconductor chips may be separated from neighboring semiconductor chips in the X-direction.

Referring to FIGS. 16 and 18C, after the Y-directional boundary regions 80y are sawn, the first sawing blade 90 and the second sawing blade 91 may be disposed on X-directional boundary regions 80x. The first sawing blade 90 and the second sawing blade 91 may be spaced apart from each other by an interval of a size of one unit semiconductor chip 50 in the Y-direction. The first and second sawing blades 90 and 91 may be moved in the X-direction to cut the semiconductor substrate 1 and the adhesive member 32. Thus, the semiconductor chips of which each includes the unit semiconductor chips 50 divided by the boundary region 80 having the groove 30 may be individually separated from each other. The semiconductor chip according to exemplary embodiments of the present inventive concept may be formed using one sawing blade.

The individually separated semiconductor chips may be mounted on the package substrate 34 and other assembling processes may be performed to manufacture the package structures described with reference to 9A to 9C, 10A to 10C, 11A to 11C, 12A to 12C, 13A to 13C, and 14.

Generally, semiconductor chips used in package mounting processes may be thin. Thus, the semiconductor chips may be warped and may not be bonded to a package substrate or a lower semiconductor chip, such that an edge of the semiconductor chip may lift off. According to exemplary embodiments of the present inventive concept, the warpage stress of a semiconductor chip may be relaxed by the groove 30 to prevent the semiconductor chip from lifting off of its substrate. Thus, process yield and reliability of a semiconductor package may be increased in a process of assembling the semiconductor package. Additionally, since the groove 30 of the boundary region 80 may be deeper than the well region 2, electrical insulation characteristics between the unit semiconductor chips 50 may be increased. Thus, the reliability of the semiconductor package may be increased.

Figure 19:
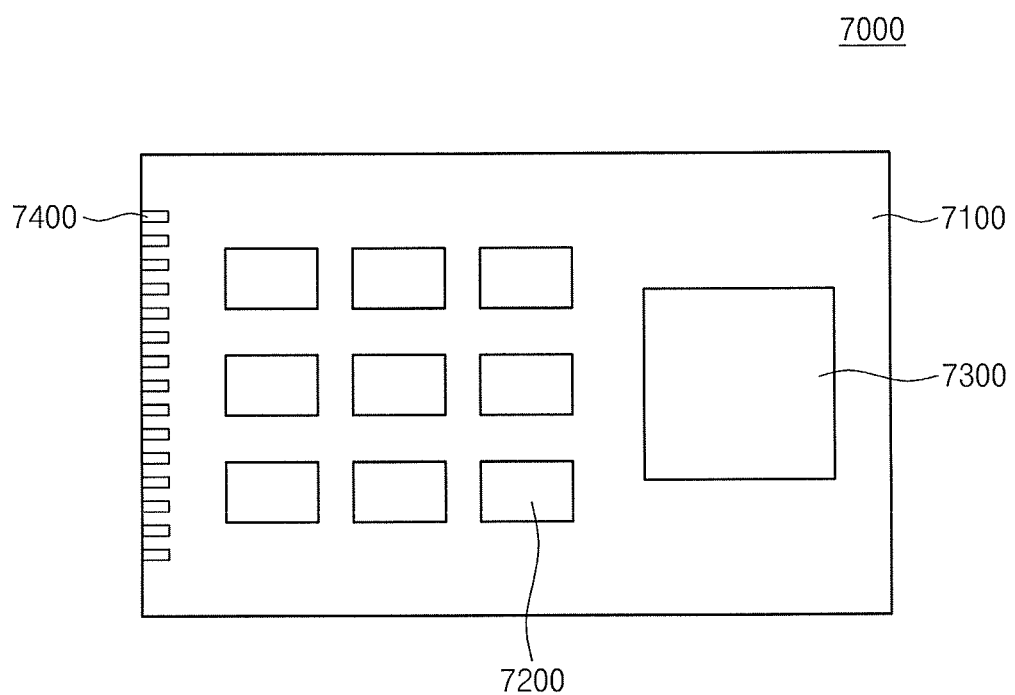
FIG. 19 is a diagram illustrating a semiconductor module including at least one of semiconductor chips and semiconductor packages according to exemplary embodiments of the present inventive concept.

FIG. 19 is a diagram illustrating a semiconductor package module 7000 including at least one of semiconductor chips and semiconductor packages according to exemplary embodiments of the present inventive concept.

Referring to FIG. 19, a semiconductor package module 700 according to exemplary embodiments of the present inventive concept may include at least one semiconductor module 7200 and a micro-processor 7300 which may be mounted on a semiconductor package module substrate 7100. The semiconductor module 7200 may include at least one of the semiconductor packages 1000, 2200, 2400, 2600, 3000, 4000, 5000, or 6000 and at least one of the semiconductor chips 100, 120, 140, 160, 180, 200, 300, 400, 500, 600, or 700 according to exemplary embodiments of the present inventive concept. The semiconductor package module substrate 7100 may be electrically connected to an external electronic device through input/output terminals 7400 disposed on at least one side of the semiconductor package module substrate 7100.

Figure 20:
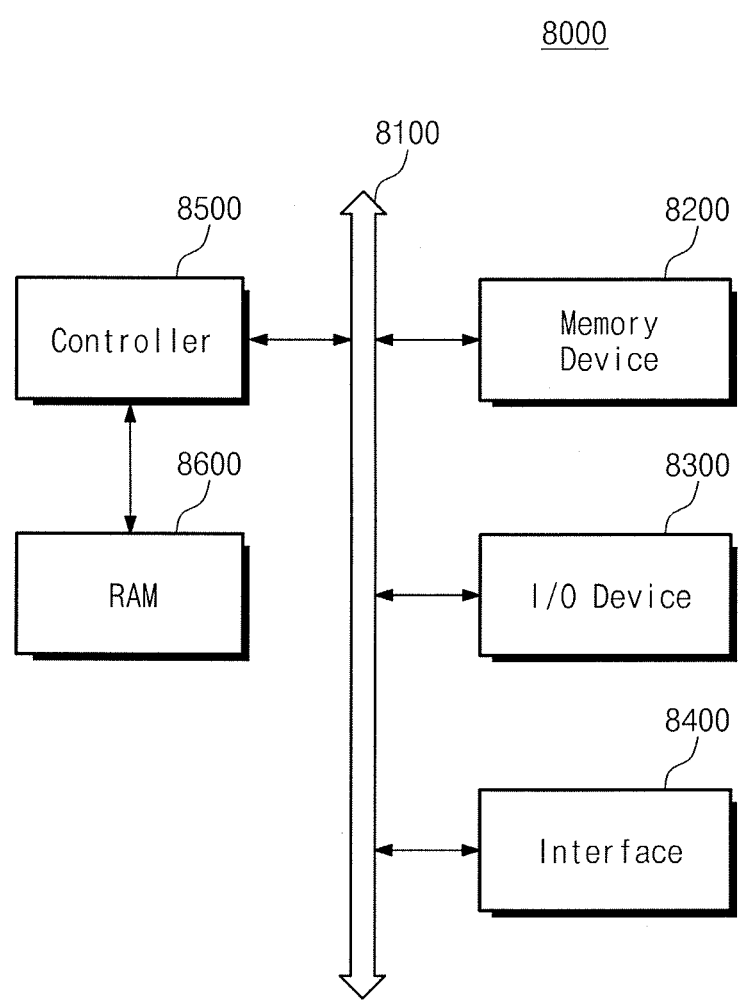
FIG. 20 is a block diagram illustrating an electronic system including at least one of semiconductor packages according to exemplary embodiments of the present inventive concept.

FIG. 20 is a schematic diagram illustrating an electronic system 8000 including at least one of the semiconductor packages 1000, 2200, 2400, 2600, 3000, 4000, 5000, or 6000 according to exemplary embodiments of the present inventive concept.

Referring to FIG. 20, an electronic system 8000 may include a controller 8500, an input/output (I/O) device 8300, and a memory device 8200. The controller 8500, the I/O device 8300, and the memory device 8200 may communicate with each other through a bus unit 8100. The bus unit 8100 may be a path through which electrical signals are transmitted. For example, the controller 8500 may include at least one of a microprocessor, a digital signal processor, a microcontroller, or other logic devices having a similar function to any one thereof. A random access memory (RAM) device 8600 may be used, for example, as an operation memory of the controller 8500. Each of the controller 8500, the memory device 8200 and the RAM device 8600 may include at least one of the semiconductor packages 1000, 2200, 2400, 2600, 3000, 4000, 5000, and/or 6000 according to embodiments of the inventive concept. The I/O unit 8300 may include a keypad, a keyboard and/or a display device. The memory device 8200 may store data. The memory device 8200 may store data and/or commands executed by the controller 8500. The electronic system 8000 may further include an interface unit 8400 for transmitting data to and/or receiving data from a communication network. The interface unit 8400 may operate wirelessly or through a cable. For example, the interface unit 8400 may include an antenna for wireless communication or a transceiver for cable communication. The electronic system 8000 may further include an application chipset, and/or a camera image sensor (CIS).

According to exemplary embodiments of the present inventive concept, at least two unit semiconductor chips sharing the semiconductor substrate of the one-body type may be stacked on the package substrate. Thus, thicknesses and sizes of the semiconductor packages may be reduced.

According to exemplary embodiments of the present inventive concept, the lift-off phenomenon of the semiconductor chip may be prevented in the assembling process of the semiconductor chip. Thus, the yield and reliability of the semiconductor packages may be increased.

According to exemplary embodiments of the present inventive concept, a groove may be formed in a boundary region between the unit semiconductor chips. Thus, electrical interference between the unit semiconductor chips may be prevented or minimized and electrical characteristics of the semiconductor packages may be improved.

While the inventive concept has been particularly shown and described with reference to exemplary embodiments thereof, it will be understood by those of ordinary skill in the art that various changes in form and detail may be made therein without departing from the spirits and scope of the inventive concept, as defined by the following claims.

What is claimed is:

1. A semiconductor package, comprising:
   a package substrate;
   a first semiconductor chip on the package substrate, wherein the first semiconductor chip includes a first chip region and first chip pads formed on a top surface of the first chip region; and
   a second semiconductor chip on the package substrate, wherein the second semiconductor chip includes a second chip region and second chip pads formed on a top surface of the second chip region,
   wherein the first chip region and the second chip region are divided from each other by a boundary region having a groove;
   wherein the first chip region, the second chip region and the boundary region share a semiconductor substrate of a one-body type, and
   wherein an adhesive member is disposed on a bottom surface of the first and second chip regions and the boundary region, and wherein a bottom surface of the groove is disposed above a top surface of the adhesive member.

2. The semiconductor package of claim 1, wherein each of the first and second chip regions includes a well region.

3. The semiconductor package of claim 2, wherein the bottom surface of the groove is lower than a bottom of the well region.

4. The semiconductor package of claim 2, further comprising:
a molding member formed on the package substrate.

5. The semiconductor package of claim 4, wherein at least a portion of the groove is filled with the molding member.

6. The semiconductor package of claim 1, wherein each of the first and second semiconductor chips includes four sides;
wherein the first chip pads of the first semiconductor chip are disposed adjacent to at least one of the four sides of the first semiconductor chip crossing an extending direction of the groove; and
wherein the second chip pads of the second semiconductor chip are disposed adjacent to at least one of the four sides of the second semiconductor chip crossing the extending direction of the groove.

7. The semiconductor package of claim 1, wherein each of the first and second semiconductor chips comprises four sides;
wherein the first chip pads of the first semiconductor chip are disposed adjacent to at least one of the four sides of the first semiconductor chip parallel to an extending direction of the groove; and
wherein the second chip pads of the second semiconductor chip are disposed adjacent to at least one of the four sides of the second semiconductor chip parallel to the extending direction of the groove.

* * * * *